(12) United States Patent
Hiroki

(10) Patent No.: US 10,658,160 B2
(45) Date of Patent: May 19, 2020

(54) STAGE AND SUBSTRATE PROCESSING APPARATUS

(71) Applicant: TOKYO ELECTRON LIMITED, Tokyo (JP)

(72) Inventor: Tsutomu Hiroki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 383 days.

(21) Appl. No.: 15/526,723

(22) PCT Filed: Nov. 5, 2015

(86) PCT No.: PCT/JP2015/081187
§ 371 (c)(1),
(2) Date: May 12, 2017

(87) PCT Pub. No.: WO2016/076201
PCT Pub. Date: May 19, 2016

(65) Prior Publication Data
US 2017/0316923 A1    Nov. 2, 2017

(30) Foreign Application Priority Data
Nov. 12, 2014    (JP) .................................. 2014-229995

(51) Int. Cl.
*H01J 37/32*    (2006.01)
*H01L 21/67*    (2006.01)
(Continued)

(52) U.S. Cl.
CPC .. *H01J 37/32724* (2013.01); *H01J 37/32715* (2013.01); *H01L 21/3065* (2013.01);
(Continued)

(58) Field of Classification Search
CPC ........... H01J 37/32724; H01J 37/32715; H01J 2237/2065; H01J 2237/20271;
(Continued)

(56) References Cited

U.S. PATENT DOCUMENTS 5,591,269 A * 1/1997 Arami ................. C23C 16/4586
    118/723 R
7,789,962 B2 * 9/2010 Iwasaki .............. G05D 23/1902
    118/728
(Continued)

FOREIGN PATENT DOCUMENTS

| EP | 1211912 A1 * | 6/2002 | ............... H05B 3/68 |
| JP | H10-284382 A | 10/1998 | |
| JP | 2006-286733 | 10/2006 | |

OTHER PUBLICATIONS

International Search Report dated Jan. 19, 2016.

*Primary Examiner* — Aiden Lee
(74) *Attorney, Agent, or Firm* — Fenwick & West LLP

(57) ABSTRACT

A stage includes a plate having a top surface on which a substrate is to be placed and a bottom surface; a plurality of first tubes each extending toward different regions of the bottom surface and providing opening ends facing the bottom surface; a partition wall defining a plurality of spaces surrounding the respective first tubes, the spaces forming a plurality of flow passages through which a heat exchange medium discharged from the first tubes flows; and a plurality of second tubes connected to the partition wall to communicate with the respective flow passages. The stage further includes a plurality of adjusting mechanisms provided in the respective flow passages. Each of the adjusting mechanisms is configured to be deformed depending on the temperature of the heat exchange medium in the corresponding flow (Continued)

passage to adjust the conductance of the flow passage in accordance with the temperature.

3 Claims, 16 Drawing Sheets

(51) Int. Cl.
*H01L 21/687* (2006.01)
*H01L 21/3065* (2006.01)
*H01L 21/683* (2006.01)

(52) U.S. Cl.
CPC .. *H01L 21/67069* (2013.01); *H01L 21/67103* (2013.01); *H01L 21/67109* (2013.01); *H01L 21/67248* (2013.01); *H01L 21/6831* (2013.01); *H01L 21/68757* (2013.01); *H01L 21/68785* (2013.01); *H01J 2237/2001* (2013.01); *H01J 2237/334* (2013.01)

(58) Field of Classification Search
CPC ........... H01L 21/68785; H01L 21/6831; H01L 21/683; H01L 21/67253; H01L 21/67103; H01L 21/67109; C23C 14/541; C23C 16/4586; C23C 16/46; C23C 16/466
See application file for complete search history.

(56) References Cited

U.S. PATENT DOCUMENTS

| | | | |
|---|---|---|---|
| 7,940,527 B2 * | 5/2011 | Krause | H01L 23/473 165/147 |
| 2006/0219360 A1 | 10/2006 | Iwasaki | |
| 2012/0279242 A1 | 11/2012 | Seybold et al. | |

* cited by examiner

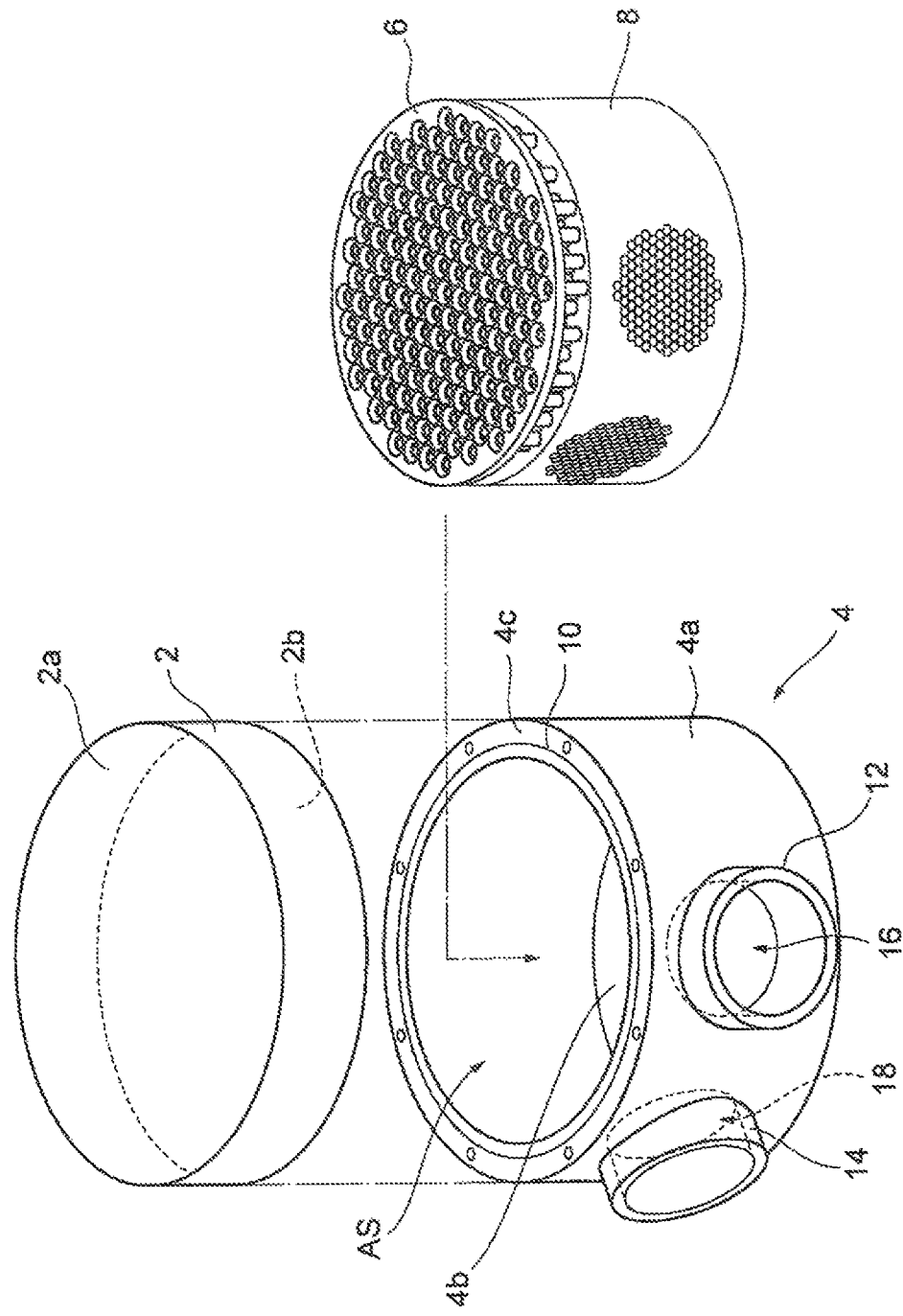

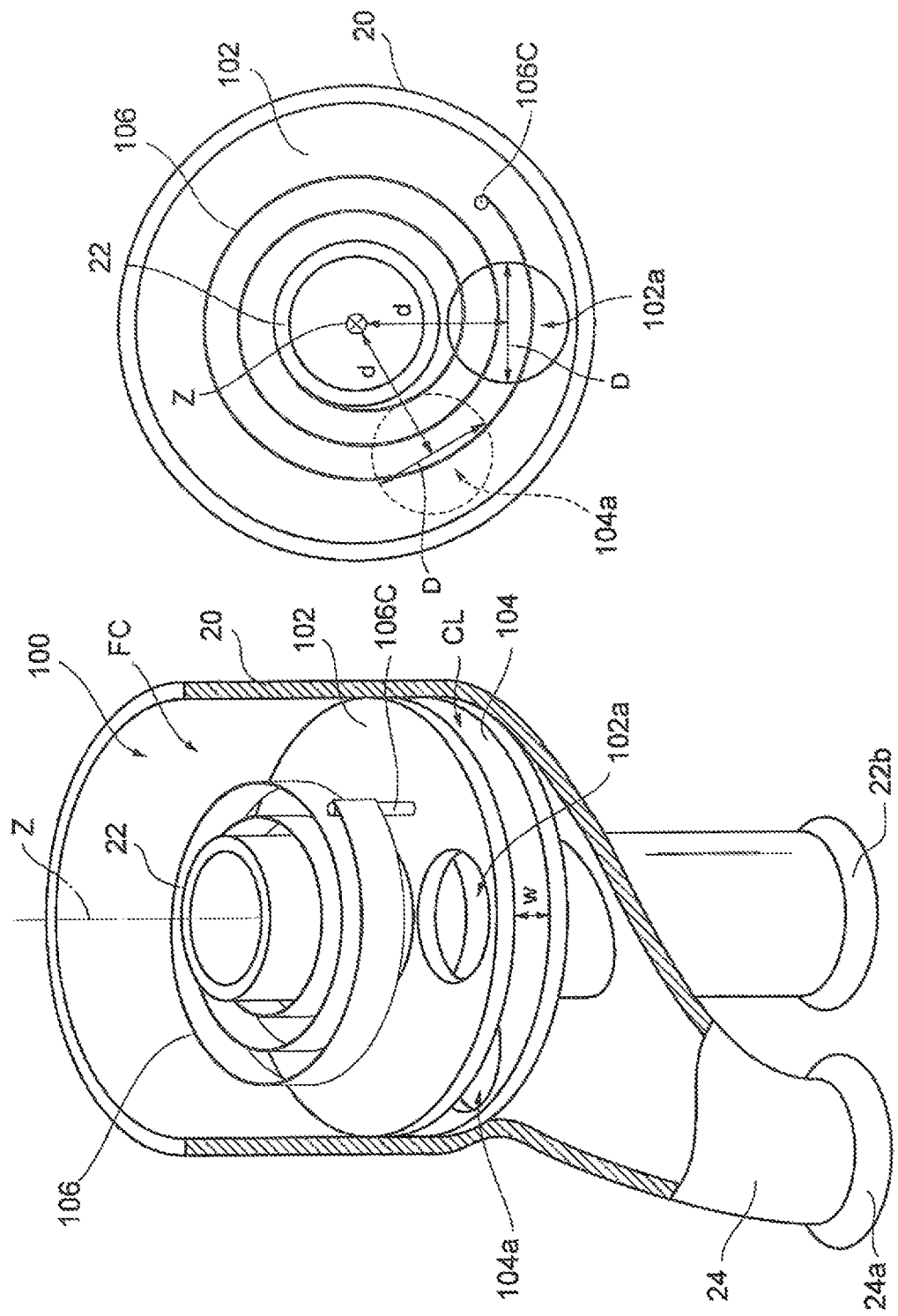

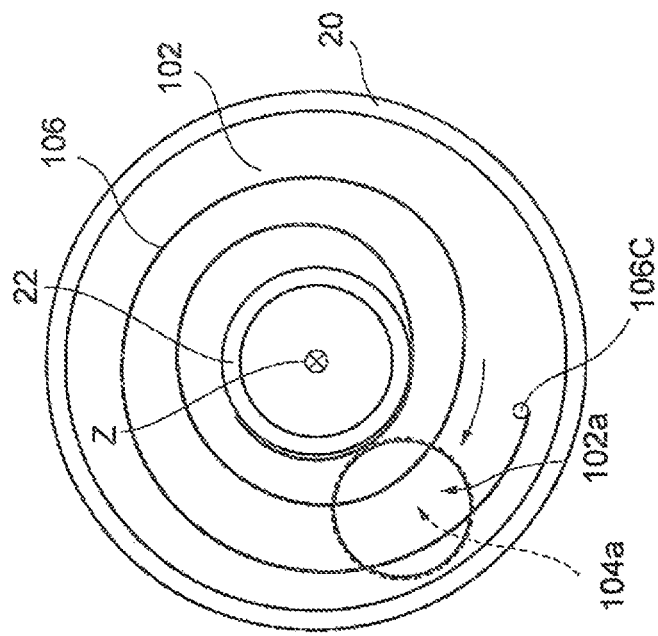
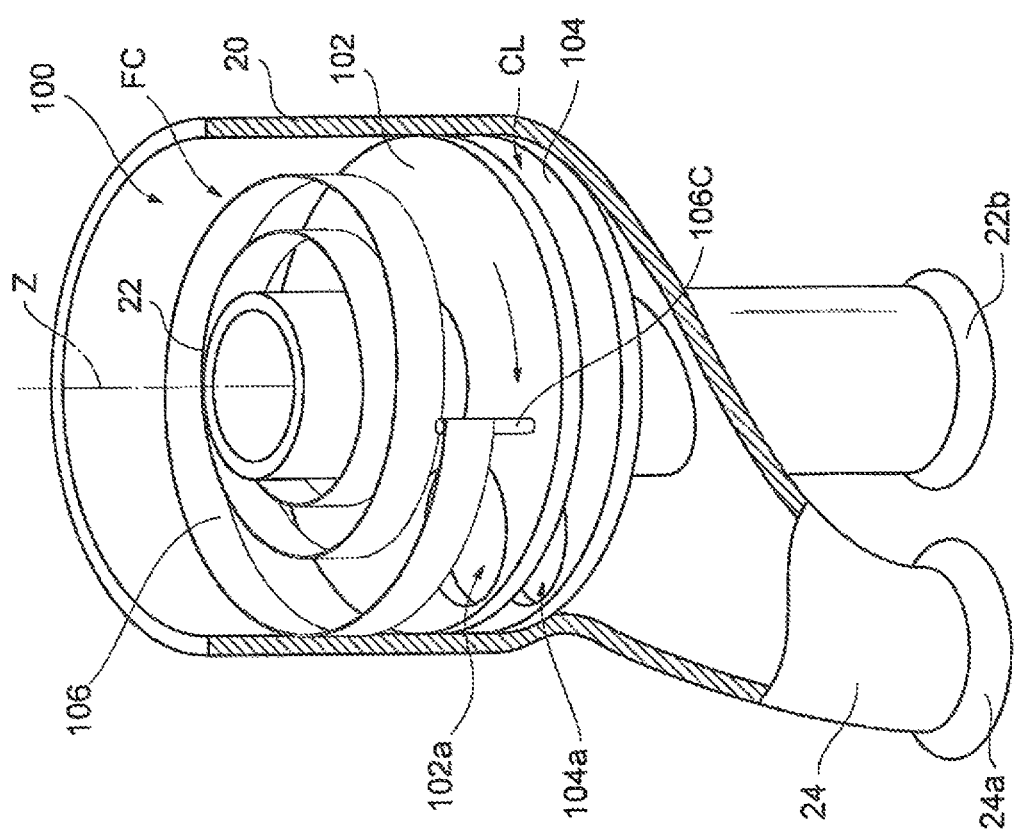

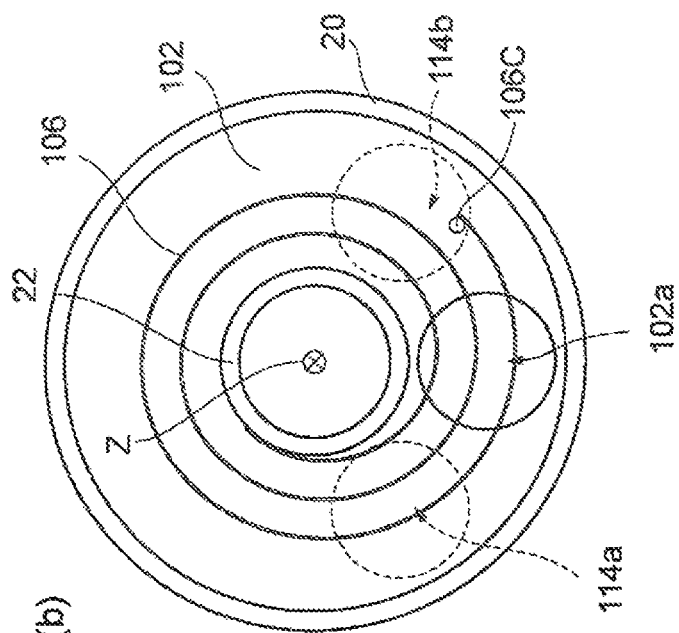
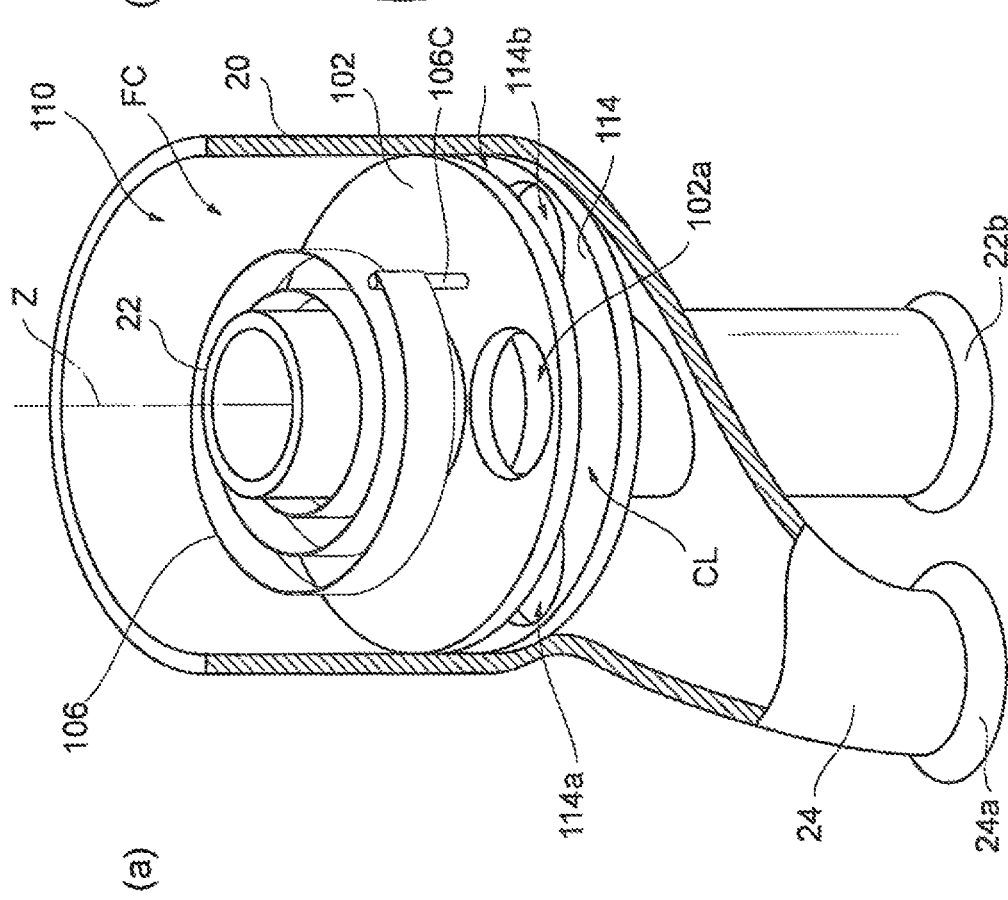
FIG. 10A
FIG. 10B

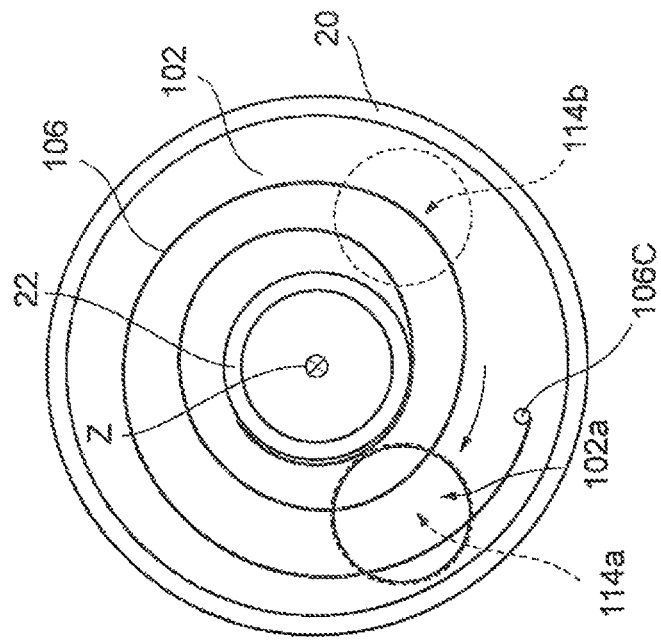
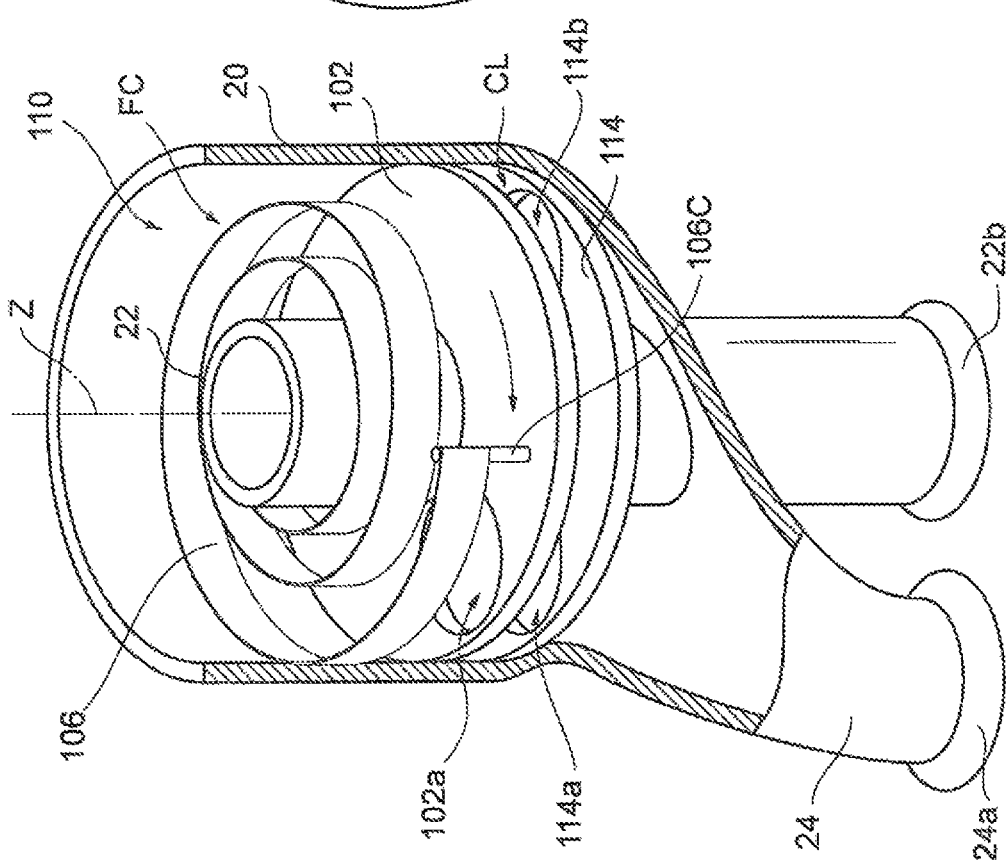

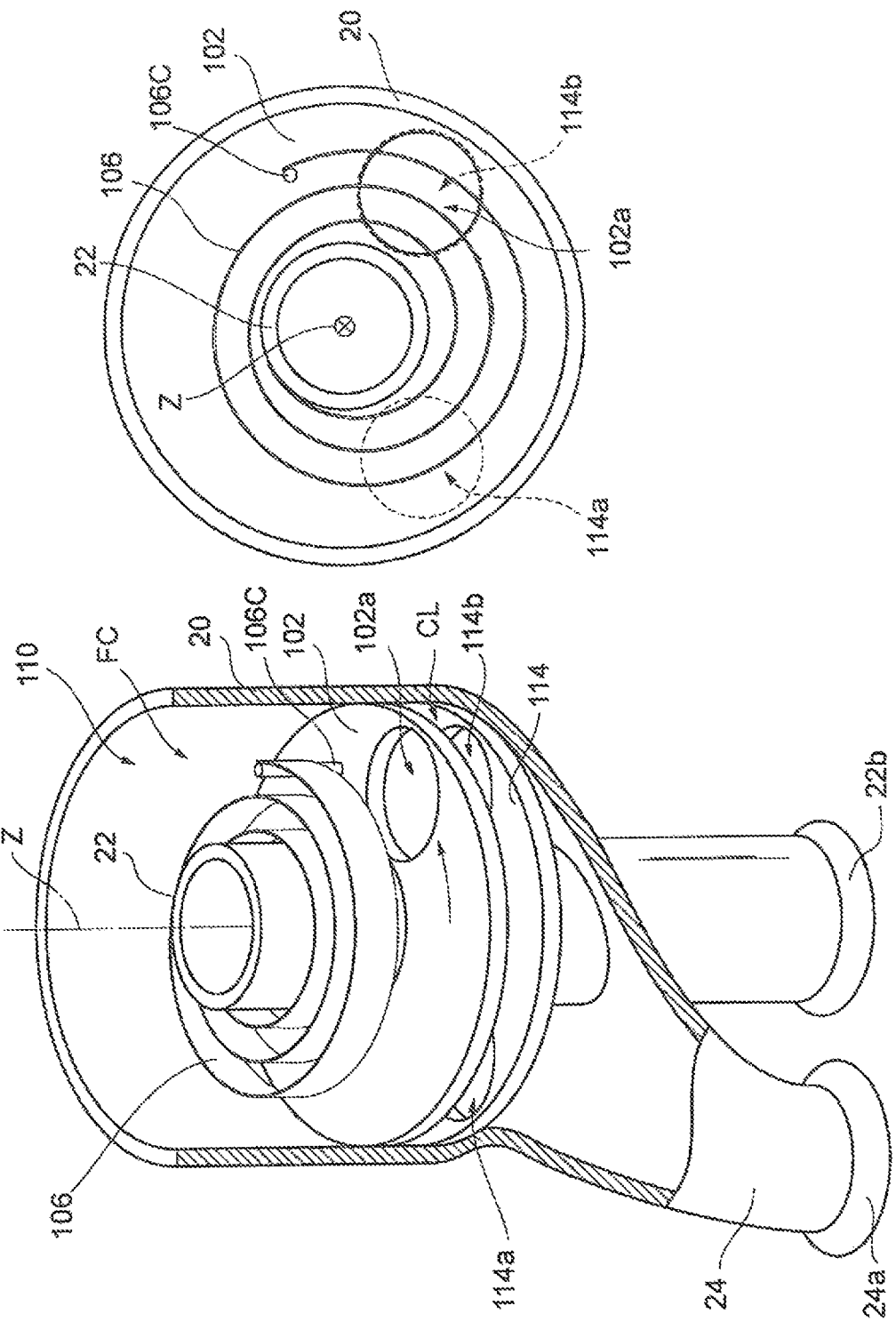

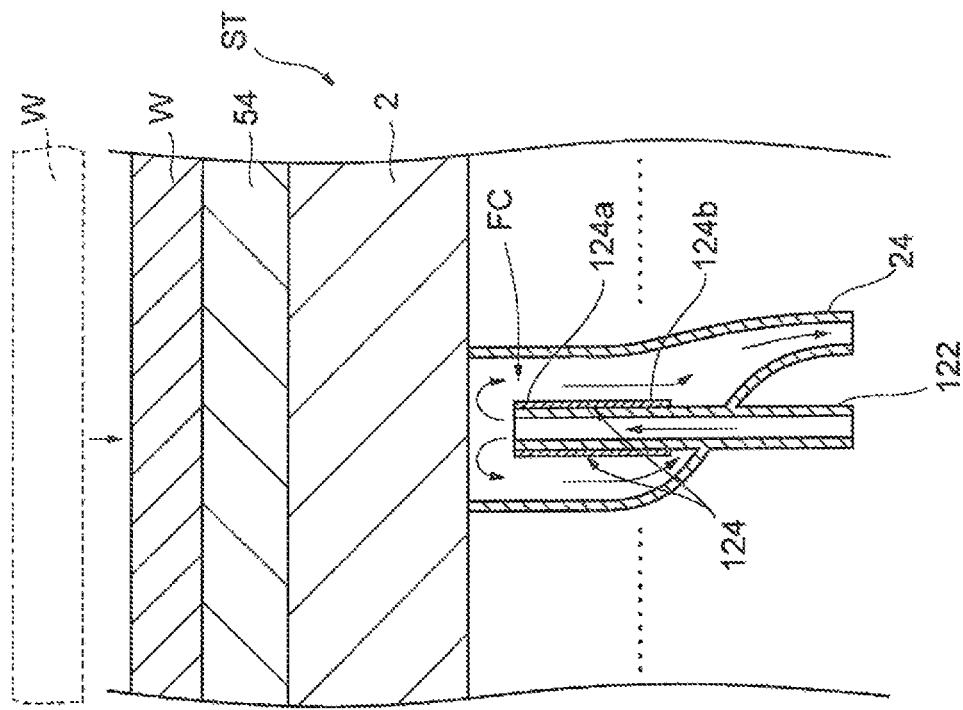
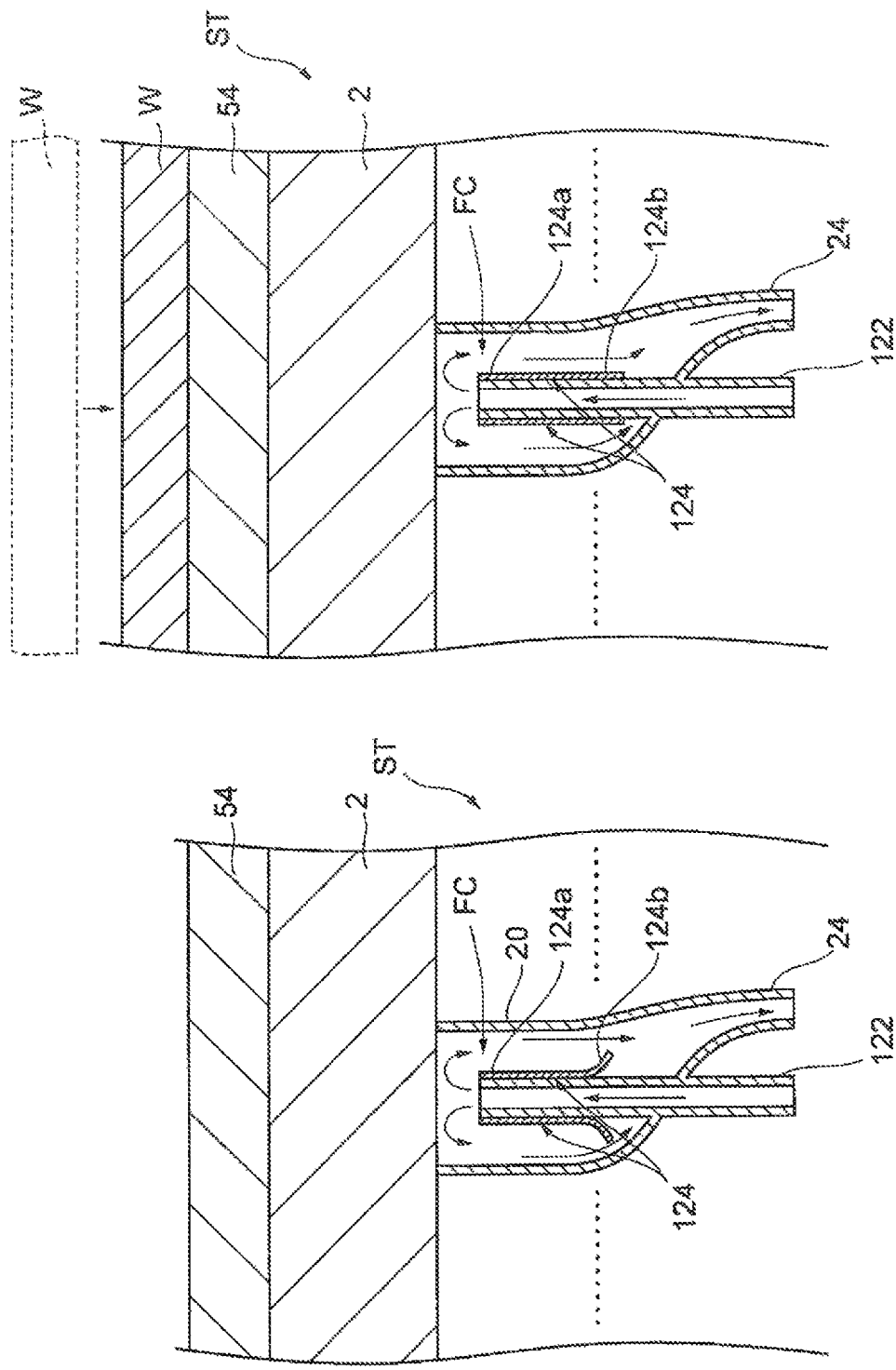

STAGE AND SUBSTRATE PROCESSING APPARATUS

CROSS REFERENCE TO RELATED APPLICATIONS

This application is a National Stage Application of, and claims priority to, PCT Application No. PCT/JP2015/081187, filed on Nov. 5, 2015, entitled "STAGE AND SUBSTRATE PROCESSING APPARATUS," which claims priority to Japanese Patent Application Mo. 2014-229995, filed on Nov. 12, 2014. The foregoing patent applications are herein incorporated by reference by entirety for all purposes.

FIELD OF THE INVENTION

The present invention relates to a stage and a substrate processing apparatus.

BACKGROUND OF THE INVENTION

A substrate processing apparatus includes a stage for supporting a substrate in an evacuable processing chamber. The stage may have a function of controlling a temperature of a substrate. An example of the stage is disclosed in Patent Document 1.

Patent Document 1 discloses therein a temperature control device including a mounting table, a chiller unit, a heating unit, a flow path switching unit, and a controller. The mounting table has a first coolant passageway extending along a circumferential direction of the mounting table at a central region of the mounting table and a second, coolant passageway extending along the circumferential direction of the mounting table at a peripheral region of the mounting table. The chiller unit has an output port and a return port. The output port is connected to an inlet of the first coolant passageway through a first flow line. The return port of the chiller unit is connected to an outlet of the second coolant passageway through a second flow line.

A heating unit for heating a coolant flowing through the first flow line is connected to the first flow line. The flow path switching unit is connected to the second flow lines. The flow path switching unit has a plurality of valves for switching connection relation between the first coolant passageway and the second coolant passageway. In this device, a temperature of the coolant supplied to the first and the second coolant passageway is individually adjusted by controlling opening/closing of the valves of the flow path switching unit and the operation of the heating unit.

Patent Document 1: Japanese Patent Application Publication Mo. 2006-286733

In the device disclosed in Patent Document 1, when a temperature of a substrate is deviated from a target temperature by an external factor such as heat input from a plasma, temperature variation of the substrate can be corrected by individually controlling a temperature of the coolant supplied to the first and the second coolant passageway. However, in this device, the heating unit for heating the temperature is installed at the outside of the mounting table and, thus, there is a difference between operation timing of the heating unit and timing of supplying the coolant of a controlled temperature to the mounting table. Accordingly, in the device disclosed in Patent Document 1, a long period of time may be required until the temperature variation caused by the external factor is corrected.

SUMMARY OF THE INVENTION

In this technical field, there are required a stage and a substrate processing apparatus capable of correcting temperature variation caused by an external factor within a short period of time.

In accordance with an aspect of the present invention, there is provided a stage including: a plate having a top surface on which a substrate is mounted and a bottom surface; a plurality of first tubes extending toward different regions of the bottom surface, each of the first tubes having an opening end facing the bottom surface; a partition wall defining a plurality of spaces surrounding the respective first tubes, the spaces respectively forming a plurality of flow passages through which a heat exchange medium discharged from the first tubes flows; a plurality of second tubes connected to the partition wall to communicate with the respective flow passages; and a plurality of adjusting mechanisms provided in the respective flow passages and configured to be deformed depending on a temperature of the heat exchange medium in the respective flow passages to adjust a conductance of the flow passages in accordance with the temperature.

With such configuration, the adjusting mechanism is deformed so that and the conductance of each of the flow passages is adjusted to a conductance corresponding to the temperature of the heat exchange medium flowing through the corresponding flow passage. When the conductance of the flow passage is changed by the adjusting mechanism, the flow rate of the heat exchange medium flowing in the flow passage is changed. Therefore, the amount of heat exchanged between the plate and the heat exchange medium is changed. Accordingly, by adjusting the conductance of each of the flow passages to the conductance corresponding to the temperature of the heat exchange medium, it is possible to correct the temperature of the stage. Further, in the stage, since the adjusting medium is provided in the flow passage, the temperature of the stage can be corrected within a short period of time when the temperature of the stage is changed by an external factor.

In one embodiment, at least a part of each of the adjusting mechanisms may have a bimetal structure in which two plates having different thermal expansion coefficients are bonded. In this embodiment, the bimetal structure is deformed depending on the temperature of the heat exchange medium in the flow passage, and the conductance of the flow passage can be adjusted to a conductance corresponding to the temperature of the heat exchange medium.

In one embodiment, each of the adjusting mechanisms may includes a first annular plate provided between the first tube and the partition wall to be rotatable about a central axis of the first tube, the first annular plate having a first through-hole formed at a position radially spaced from the central axis by a predetermined distance; a second annular plate fixed to face the first annular plate, the second annular plate having a second through-hole formed at a position radially spaced from the central axis by the predetermined distance; and a deformation member configured to be deformed depending on a temperature of the heat exchange medium to rotate the first annular plate about the central axis such that a relative distance between the first through-hole and the second through-hole in a circumferential direction with respect to the central axis varies.

In the above embodiment, the relative distance between the first through-hole and the second through-hole in the circumferential direction with respect to the central axis varies depending on the temperature of the heat exchange medium. When the relative distance becomes minimum, i.e., when the first through-hole is disposed directly above the second through-hole, the heat exchange medium discharged from the opening end flows through the first through-hole and the second through-hole, and the conductance of the flow passage is increased. On the other hand, when the relative distance is increased, i.e., when the first through-hole is not disposed directly above the second through-hole, the flow of the heat exchange medium is disturbed by the first annular plate and the conductance of the flow passage is decreased. As such, in the above embodiment, it is possible to change the conductance of the flow passage in accordance with the change of the temperature of the heat exchange medium.

In one embodiment, the second annular plate may further include a third through-hole formed at a position radially spaced from the central axis by the predetermined distance, the second through-hole may be disposed at one side in the circumferential direction with respect to a circumferential position of the first through-hole at a reference temperature, and the third through-hole may be disposed at the other side in the circumferential direction with respect to the circumferential position of the first through-hole at the reference temperature.

In the above embodiment, when the temperature of the heat exchange medium is deviated from the reference temperature, the first through-hole is disposed directly above the second through-hole or the third through-hole. Accordingly, in the above embodiment, when the temperature of the stage is increased or decreased from the reference temperature by an external factor, the conductance of the flow passage is adjusted to be increased. Therefore, in the above embodiment, it is possible to correct the temperature of the stage to the reference temperature.

In one embodiment, each of the adjusting mechanisms may be a plate-shaped body, the plate-shaped body may include one end fixed to an outer surface of the first tube and the other end that is not fixed to the outer surface of the first tube, and a distance between the other end and the first tube may vary depending on a temperature of the heat exchange medium.

In the above embodiment, the distance between the other end and the first tube varies depending on the temperature of the heat exchange medium, so that the cross sectional area of the flow passage can be changed depending on the temperature of the heat exchange medium. Accordingly, in the above embodiment, it is possible to change the conductance of the flow passage depending on the temperature of the heat exchange medium.

In accordance with another aspect, there is provided a substrate processing apparatus including: a processing chamber; and the above-described stage provided in the processing chamber.

Effect of the Invention

As described above, in accordance with various aspects and embodiments of the present invention, the temperature variation caused by the external factor can be corrected within a short period of time.

BRIEF DESCRIPTION OF THE DRAWINGS

FIG. 2 is an exploded perspective view schematically showing a stage according to an embodiment.

FIG. 6A is a perspective view of an adjusting mechanism according to an embodiment, and FIG. 6B is a top view thereof.

FIG. 7A is a perspective view of the adjusting mechanism according to the embodiment, and FIG. 7B is a top view thereof.

FIG. 10A is a perspective view of an adjusting mechanism according to another embodiment, and FIG. 10B is a top view thereof.

FIG. 11A is a perspective view of the adjusting mechanism according to another embodiment, and FIG. 11B is a top view thereof.

FIG. 12A is a perspective view of the adjusting mechanism according to another embodiment, and FIG. 12B is a top view thereof.

FIGS. 14A and 14B are cross sectional views schematically showing flow of a heat exchange medium in a heat exchanger.

DETAILED DESCRIPTION OF THE EMBODIMENTS

Figure 1:
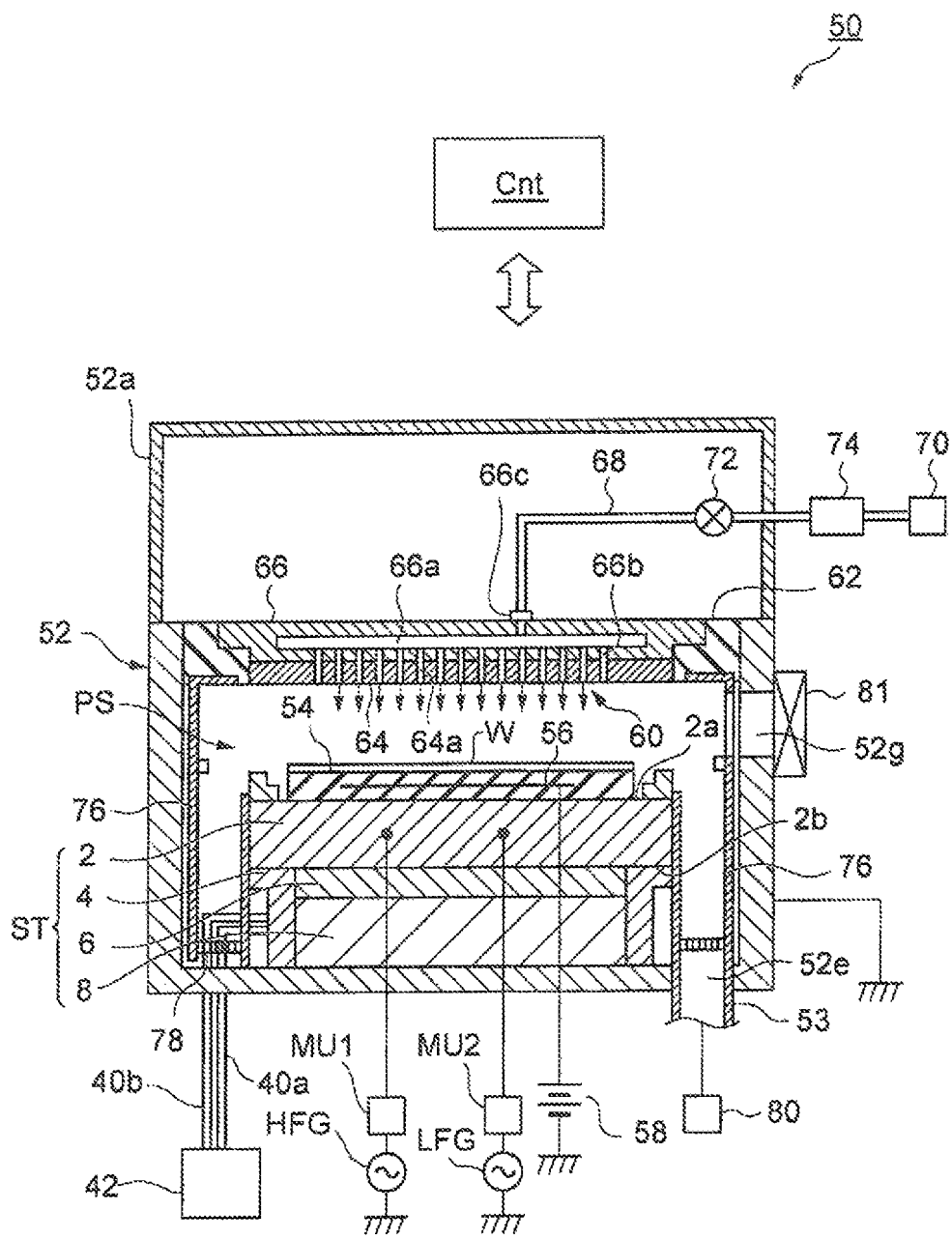
FIG. 1 is a cross sectional view schematically showing a plasma processing apparatus according to an embodiment.

Hereinafter, various embodiments will be described in detail with reference to the accompanying drawings. Like reference numerals will be used for like or corresponding parts throughout the drawings. Dimensional ratios in the drawings do not necessarily coincide with the actual dimensional ratios.

First, a substrate processing apparatus according to an embodiment will be described. FIG. 1 is a cross sectional view schematically showing a plasma processing apparatus 50 that is an example of a substrate processing apparatus. The plasma processing apparatus 50 is a capacitively coupled parallel plate type plasma etching apparatus and includes a substantially cylindrical processing chamber 52. The processing chamber 52 is made of, e.g., aluminum having an anodically oxidized surface. The processing chamber 52 is grounded.

A stage ST is provided on a bottom portion of the processing chamber 52. As shown in FIG. 1, the stage ST includes a plate 2, a case 4, a heat exchanger 6, and a flow passageway unit 8. The stage ST will be described in detail with reference to FIG. 2. FIG. 2 is an exploded perspective view of the stage ST. The stage ST shown in FIG. 2 is used as a mounting table for supporting a substrate in the processing chamber 52.

The plate 2 has a disc shape and made of a metal, e.g., aluminum. The plate 2 has a top surface 2a and a bottom surface 2b. A substrate W may be mounted on the top surface 2a of the plate 2.

The case 4 is made of a metal, e.g., stainless steel, and has a side wall 4a and a bottom wall 4b. The side wall 4a has a cylindrical shape and defines therein an accommodating space AS. The side-wall 4a extends along an axis direction of the cylindrical shape and supports the plate 2 from the bottom. The bottom wall 4b is connected to a lower end portion of the side wall 4a. An O-ring 10 extending in an annular shape along an upper end surface 4c of the sidewall 4a may be installed at the upper end surface 4c. The plate 2 is airtightly fixed to the upper end surface 4c through the O-ring 10 by, e.g., screw fixation. Accordingly, the accommodating space AS is defined by the stage. An inlet pipe 12 and an outlet pipe 14 are installed at the sidewall 4a. The inlet pipe 12 extends along a radial direction of the sidewall 4a and communicates with the accommodating space AS through a first opening 16. The outlet pipe 14 extends along a radial direction of the sidewall 4a and communicates with the accommodating space AS through a second opening 18.

Figure 3A:
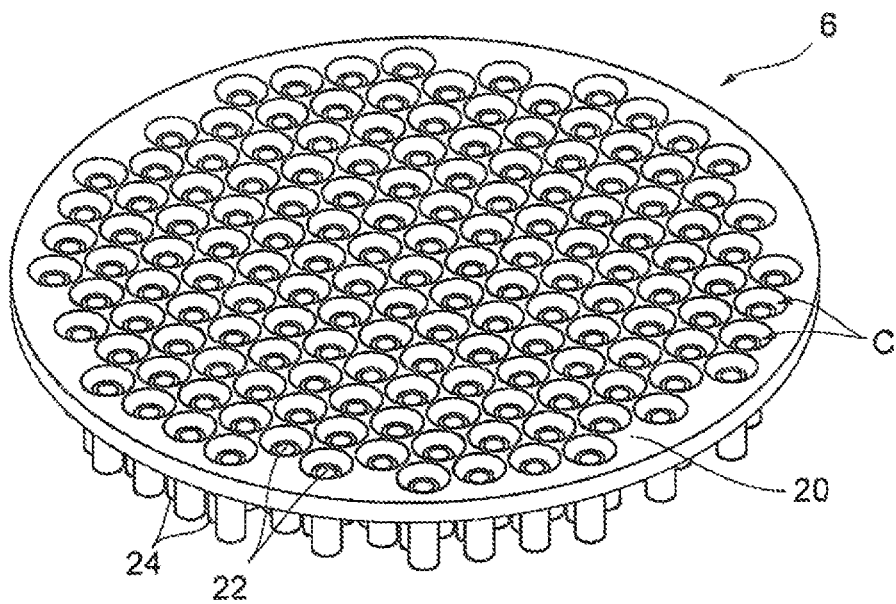
FIGS. 3A and 3B are perspective views of a heat exchanger according to an embodiment which is seen from the top and the bottom, respectively.
Figure 3B:
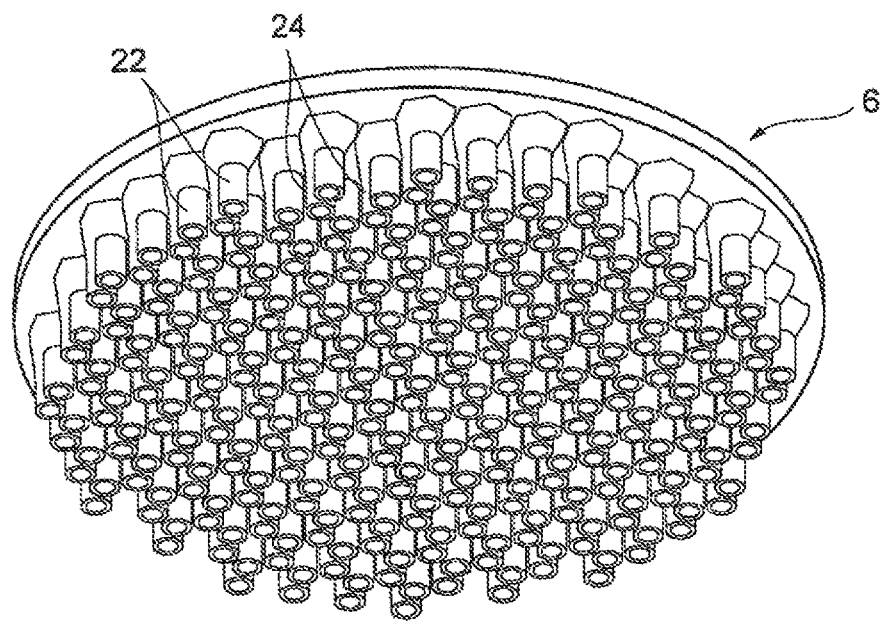

The heat exchanger 6 and the flow passageway unit 8 are accommodated in the accommodating space AS of the case 4. The heat exchanger 6 will be described in detail with reference to FIGS. 3A, 3B and 4. FIG. 3A is a perspective view of the heat exchanger 6 seen from the top. FIG. 3B is a perspective view of the heat exchanger 6 seen from the bottom. As shown in FIGS. 3A and 3B, the heat exchanger 6 includes a partition wall 20, a plurality of first tubes 22, and a plurality of second tubes 24. The heat exchanger 6 is configured to supply a heat exchange medium to a plurality of regions of the bottom surface 2b of the plate 2 which is distributed two-dimensionally without being overlapped with each other and to collect the supplied heat exchange medium.

Figure 4:
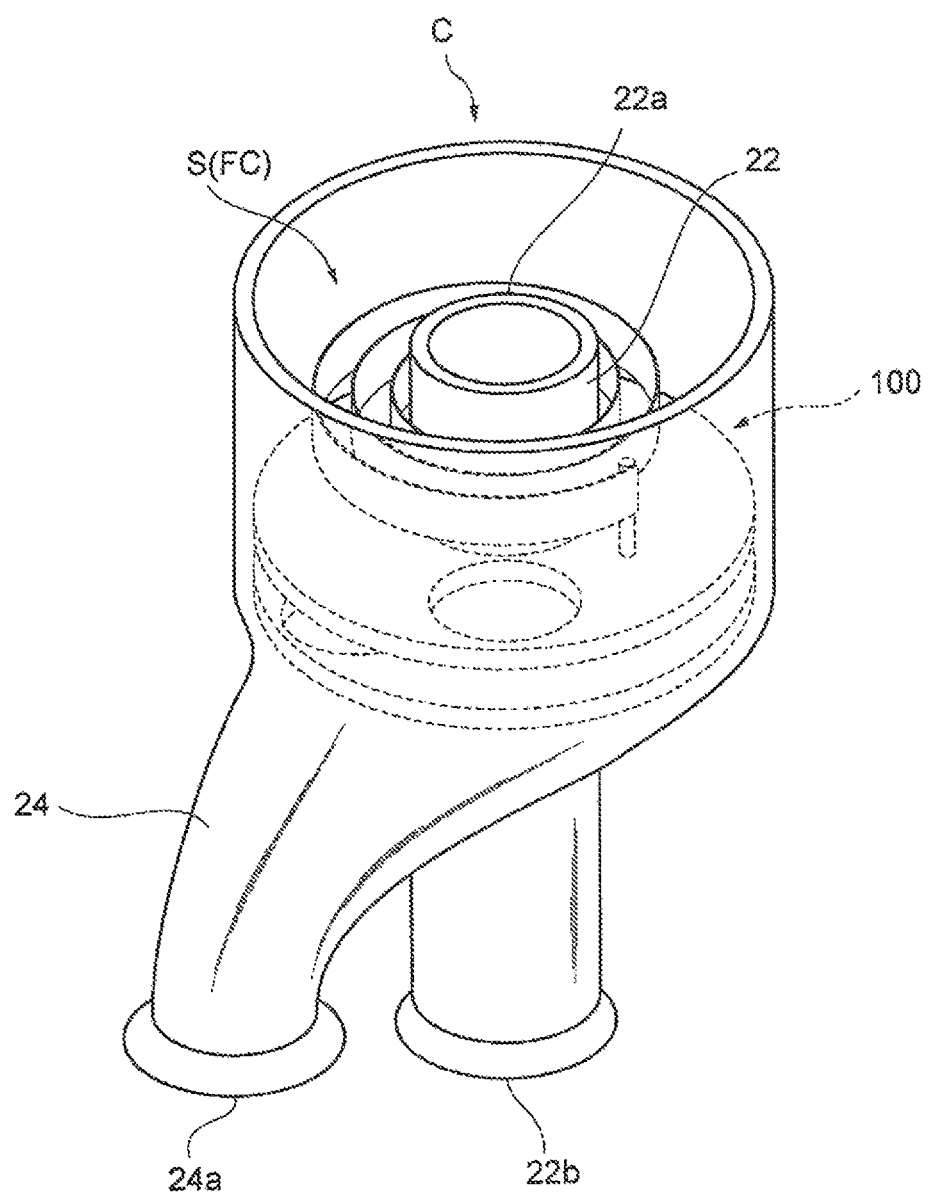
FIG. 4 is a perspective view of a single cell unit among a plurality of cell units.

The partition wall 20 entirely has a substantially circular plate shape and includes a plurality of substantially columnar cell units C. The cell units C are coupled to each other. The ceil units C define a plurality of spaces S having a circular cross sectional shape. In other words, the partition wall 20 forms the spaces S which are distributed two-dimensionally below the plate 2 without being overlapped with each other. One of the cell units C is illustrated in FIG. 4. FIG. 4 is a perspective view of the cell unit C seen from the top.

Each of the first tubes 22 extends while passing through a substantially central position of the corresponding space 8 when seen from the top. The first tubes 22 extend substantially in parallel toward the bottom surface 2b (see FIG. 2) of the plate 2. The first tubes 22 are surrounded by the partition wall 20 defining spaces around the first tubes 22. Each of the first tubes 22 has a first opening end 22a and a second opening end 22b. The first opening end 22a is disposed to face the bottom surface 2b. The second opening end 22b is positioned at an opposite side of the first opening end 22a and disposed below the space S. The first tubes 22 serve as lines for discharging the heat exchange medium supplied from a heat exchange medium supply device 42 to be described later through the first opening end 22a.

The second tubes 24 are connected to the partition wall 20 to communicate with the respective spaces S. An opening 24a is formed at a lower end portion of each of the second tubes 24. The second tubes 24 serve as pipes for discharging to the outside the heat exchange medium discharged through the first opening ends 22a of the first tubes 22 and collected in the spaces S surrounding the first tubes 22.

The spaces S surrounding the first tubes 22 serve as a plurality of flow passages FC for guiding the heat exchange medium discharged from the first opening ends 22a to the corresponding second tubes 24, respectively. In the heat exchanger 6, each of the first tubes 22, the partition wall 20 for partitioning the spaces S surrounding the first tubes, and each of the second tubes 24 communicating with the corresponding space S constitute a heat exchange unit. Therefore, the heat exchanger 6 includes a plurality of heat exchange units which is distributed two-dimensionally without being overlapped with each other. The heat exchanger 6 may be mainly made of resin. In one embodiment, the heat exchanger 6 is formed by using a 3D printer.

In each of the spaces S, an adjusting mechanisms 100 is installed. Each of the adjusting mechanisms 100 is deformed depending on a temperature of the heat exchange medium such that a conductance of the flow passage PC is adjusted to a conductance in accordance with the temperature of the heat exchange medium flowing through the flow passage PC. The adjusting mechanism 100 will be described in detail later.

Figure 5:
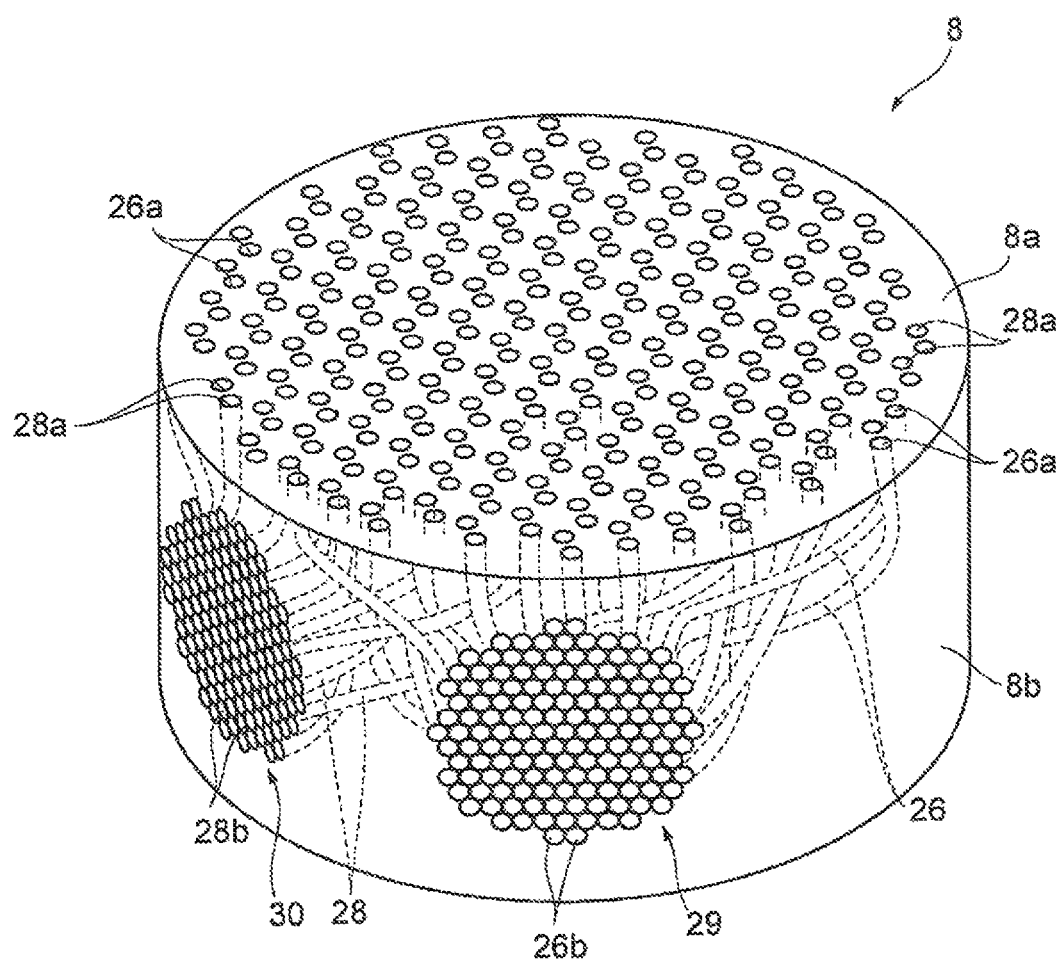
FIG. 5 is a perspective view of a flow path unit.

Next, the flow passageway unit 8 will be described. FIG. 5 is a perspective view of the flow passageway unit 8. The flow passageway unit 8 is disposed below the heat exchanger 6 and provides flow paths for supplying the heat exchange medium to the heat exchanger 6 and flow paths for collecting the heat exchange medium from the heat exchanger 6.

As shown in FIG. 5, the flow passageway unit 8 is a substantially cylindrical block body and includes a top surface 8a and a side surface 8b. The flow passageway unit 8 further includes a first collective unit 29 and a second collective unit 30 which project from the side surface 8b. The flow passageway unit 8 includes a plurality of first flow paths 26 and a plurality of second flow paths 28 penetrating therethrough. In other words, in the flow passageway unit 8, a plurality of cavities having a small diameter is formed to penetrate through the flow passageway unit 8 from the top surface 8a toward the first collective unit 29 or the second collective unit 30. The cavities serve as the first flow path 26 and the second flow path 28. The first flow paths 26 have one ends 26a and the other ends 26b. One ends 26a of the first flow paths 26 are formed at positions on the top surface 8a of the flow passageway unit 8 which correspond to the first tubes 22 of the heat exchanger 6 and connected to the second opening ends 22b of the first tubes 22. The other ends 26b of the first tubes 26 are gathered at the first collective unit 29. The first collective unit 29 is formed at a position corresponding to the first opening 16 of the case 4 and faces the first opening 16 while being accommodated in the case 4.

The second flow paths 28 include one ends 28a and the other ends 28b. One ends 28a of the second flow paths 28 are formed at positions on the top surface 8a of the flow passageway unit 8 which correspond to the openings 24a of the second tubes 24 of the heat exchanger 6 and connected to the openings 24a of the second tubes 24. The other ends 28b of the second tubes 28 are gathered at the second collective unit 30. The second collective unit 30 is formed at positions corresponding to the second opening 18 of the case 4 and faces the second opening IS while being accommodated in the case 4. In one embodiment, the flow passageway unit 8 may be mainly made of resin.

Referring back to FIG. 1, the plasma processing apparatus 50 will be described. An electrostatic chuck 54 is provided on the top surface 2a of the plate 2 of the stage ST. The electrostatic chuck 54 has a structure in which an electrode 56 made of a conductive film is embedded between two insulating layers or two insulating sheets. A DC power supply 58 is electrically connected to the electrode 56. The substrate W can be electrostatically attracted and held on the electrostatic chuck 54 by an electrostatic force such as a Coulomb force or the like which is generated by a DC voltage from the DC power supply 58.

One ends of a first tube 40*a* and a second tube 40*b* are respectively connected to the inlet pipe 12 and the outlet pipe 14 of the case 4 (see FIG. 2). The other ends of the first tube 40*a* and the second tube 40*b* are respectively connected to a supply port and a collecting port of the heat exchange medium supply device 42 installed at the outside of the processing chamber 52. The heat exchange medium supply unit 42 controls a temperature of the heat exchange medium collected from the second tube 40*b* through the collecting port to a target temperature of the stage ST and supplies the heat exchange medium of which temperature has been controlled to the target temperature of the stage ST to the first tube 40*b* through the supply port.

For example, when the target temperature of the stage ST is 50° C., the heat exchange medium of which temperature has been controlled to 50° C. is supplied to the stage ST through the first tube 40*a* and the second tube 40*b*. The heat exchange medium is fluid that flows in the stage ST for heat exchange with the plate 2. The heat exchange medium includes a coolant that absorbs heat from the plate 2 and a heat medium that transfers heat to the plate 2. The heat exchange medium is, e.g., water, fluorine-based liquid or the like.

The heat exchange medium supplied from the heat exchange medium supply device 42 is discharged from the first opening ends 22*a* of the first tubes 22 toward the bottom surface 2*b* of the plate 2 through the first tube 40*a*, the inlet pipe 12, and the first flow paths 26. The heat exchange medium collected in the second tubes 24 is returned to the heat exchange medium supply device 42 through the second flow paths 28, the outlet pipe 14 and the second tube 40*b*. By circulating the heat exchange medium between the heat exchange medium supply device 42 and the stage ST, a temperature of the substrate W mounted on the electrostatic chuck 54 is controlled to a target temperature. The temperature of the heat exchange medium supplied from the heat exchange medium supply device 42 can be controlled by a control unit Cnt to be described later.

An upper electrode 60 is provided in the processing chamber 52. The upper electrode 60 is disposed above the plate 2 serving as a lower electrode to face the plate 2. The plate 2 and the upper electrode 60 are disposed substantially in parallel with each other. The upper electrode 60 serves as a unit for generating a plasma together with the lower electrode. A processing space PS for performing plasma etching on, e.g., the substrate W, is defined between the upper electrode 60 and the plate 2.

The upper electrode 60 is supported at an upper portion of the processing chamber 52 through an insulating shield member 62. The upper electrode 60 may include an electrode plate 64 and an electrode holder 66. The electrode plate 64 faces the processing space PS and has a plurality of gas injection holes 64*a*. The electrode plate 64 may be made of a semiconductor or a conductor of low resistance having small low Joule heat. The electrode plate 64 is grounded.

The electrode holder 66 detachably holds the electrode plate 64. The electrode holder 66 may be made of a conductive material, e.g., aluminum. The electrode holder 66 may have a water cooling structure. A gas diffusion space 66*a* is provided in the electrode holder 66. A plurality of gas holes 66*b* communicating with the gas injection holes 64*a* extends downward from the gas diffusion space 66*a*. A gas inlet port 66*c* for guiding a processing gas into the gas diffusion space 66*a* is formed at the electrode holder 66. A gas supply line 68 is connected to the gas inlet port 66*c*.

A gas source 70 is connected to the gas supply line 68 via a valve 72 and a mass flow controller (MFC) 74. A flow control system (FCS) may be provided instead of the MFC. The gas source 70 is a gas source of a processing gas. The processing gas from the gas source 70 reaches the gas diffusion space 66*a* from the gas supply line 68 and is injected to the processing space PS through the gas holes 66*b* and the gas injection holes 64*a*. The gas supply line 68 and the gas source 70 serve as a gas supply unit.

The plasma processing apparatus 50 may further include a ground conductor 52*a*. The ground conductor 52*a* has a substantially cylindrical shape and extends upward from the sidewall of the processing chamber 52 to a position above the upper electrode 60.

In the plasma processing apparatus 50, a deposit shield 76 is detachably installed along an inner wall of the processing chamber 52. The deposit shield 76 is also installed at an outer periphery of the stage ST. The deposit shield 76 prevents adhesion of etching by-products (deposits) to the processing chamber 52. The deposit shield 76 may be formed by coating ceramic such as $Y_2O_3$ or the like on an aluminum material.

At a lower portion in the processing chamber 52, a gas exhaust plate 78 is provided between the stage ST and the inner wall of the processing chamber 52. The gas exhaust plate 78 may be formed by coating ceramic such as $Y_2O_3$ or the like on an aluminum material, for example. In the processing chamber 52, a gas exhaust port 52*e* is provided below the gas exhaust plate 78. A gas exhaust unit 80 is connected to the gas exhaust port 52*e* through a gas exhaust line 53. The gas exhaust unit 80 includes a vacuum pump such as a turbo molecular pump or the like and, thus, a pressure in the processing chamber 52 can be decreased to a desired vacuum level. A loading/unloading port 53*g* is provided at the sidewall of the processing chamber 52 and can be opened and closed by a gate valve 81.

In one embodiment, the plasma processing apparatus 50 further includes a high frequency power supply HFG, a high frequency power supply LPG, a matching unit MU1, and a matching unit MU2. The high frequency power supply HFG generates a high frequency power for plasma generation and supplies a high frequency power having a frequency of 27 MHz or above, e.g., 40 MHz, to the plate 2 via the matching unit MU1. The matching unit MU1 includes a circuit for matching an internal (or output) impedance of the high frequency power supply HFG to a load impedance. The high frequency power supply LFG generates a high frequency bias power for ion attraction and supplies a high frequency bias power having a frequency of 13.56 MHz or less, e.g., 3 MHz, to the plate 2 via the matching unit MU2. The matching unit MU2 includes a circuit for matching an internal (or output) impedance of the high frequency power supply LFG to a load impedance. The lower electrode and the plate 2 may be provided as separate members.

In one embodiment, the plasma processing apparatus 50 may further include the control unit Cnt. The control unit Cnt is a computer including a processor, a storage unit, an input device, a display device and the like, and controls the respective components of the plasma processing apparatus 50, e.g., a power system, a gas supply system, a driving system, and the like. In the control unit Cnt, an operator can input commands or the like by using the input device in order to manage the plasma processing apparatus 50 and visualize and display an operational state of the plasma, processing apparatus 50 by using the display device. The storage unit of the control unit Cnt stores a control program for controlling various processes performed by the plasma processing apparatus 50 by the processor, or a program, i.e., a processing recipe, for allowing the respective components of the plasma processing apparatus 50 to perform processes based on the processing condition.

Next, an adjusting mechanism according to an embodiment will be described. FIG. 6A is a perspective view of the adjusting mechanism 100 according to the embodiment. In FIG. 6A, a part of the partition wall 20 of the heat exchanger 6 is cutout and FIG. 6B is a top view thereof.

As shown in FIG. 6A, the adjusting mechanism 100 is provided in a flow passage FC formed between the partition wall 20 and the first tube 22. The adjusting mechanism 100 is deformed depending on a temperature of the heat exchange medium flowing through the flow passage FC to adjust a conductance of the flow passage FC to a conductance in accordance with a temperature of the heat exchange medium. More specifically, depending on the temperature of the heat exchange medium flowing through the flow passage FC, the adjusting mechanism 100 operates in a normal mode or in a first correction mode. The normal mode and the first correction mode are different in the conductance of the flow passage FC.

First, a configuration of the adjusting mechanism 100 will be described. The adjusting mechanism 100 includes a first annular plate 102, a second annular plate 104, and a deformation member 106. The first and the second annular plate 102 and 104 are annular plates, each having a central opening. The first and the second annular plate 104 and 106 are installed between the first tube 22 and the partition wall 20 in a state where the first tube 22 is inserted into the central openings. The first and the second annular plate 102 and 104 may be made of any material such as resin, metal or the like.

The first annular plate 102 is provided between the first tube 22 and the partition plate 20 to be rotatable about a central axis 2 of the first tube 22. A first through-hole 102a penetrating in a plate thickness direction is formed at a position which is radially deviated by a predetermined distance d from the central axis Z of the first annular plate 102. In other words, the first through-hole 102a is a circle having the diameter D.

The second annular plate 104 is provided below the first annular plate 102. The second annular plate 104 is an annular plate having the same diameter as that of the first annular plate 102 and fixed coaxially with respect to the first annular plate 102. A second through-hole 104a penetrating in the plate thickness direction is formed at a position which is radially deviated by the predetermined distance d from the central axis Z of the second annular plate 104. In other words, the second through-hole 104a is formed at a position through which the first through-hole 102a passes when seen along the central axis Z in the case of rotating the first annular place 102 about the central axis Z. The second through-hole 104a has the same diameter as that of the first through-hole 102a. In other words, the second through-hole 104a is a circle having the diameter D.

The first annular plate 102 and the second annular plate 104 face each other via a gap CL. A distance between the first annular plate 102 and the second annular plate 104, i.e., a width w of the gap CL, is smaller than the diameter D of the first and the second through-hole 102a and 104a.

A deformation member 106 is provided above the first annular plate 102. The deformation member 106 is deformed depending on a temperature. Further, the deformation member 106 has a function of rotating the first annular plate 102 about the central axis 2 such that a relative circumferential distance between the first, through-hole 102a and the second through-hole 104a with respect to the central axis Z varies.

The deformation member 106 is a strip-shaped body formed by coupling a curved plate having a relatively high thermal expansion coefficient and a curved plate having a relatively low thermal expansion coefficient. The deformation member 106 is wound in a spiral shape around the first tube 22 such that the curved plate having a relatively high thermal expansion coefficient is disposed at an outer side. In other words, the deformation member 106 has a bimetal structure in which two plates having different thermal expansion coefficients are bonded.

The deformation member 106 has one end and the other end. One end of the deformation member 106 is fixed to an outer surface of the first tube 22. The other end of the deformation member 106 is connected to the first annular plate 102 via a connecting part lose.

When the temperature is increased, the deformation member 106 is deformed such that the outer curved plate of the deformation member 106 is expanded compared to the inner curved plate and a curvature is increased. In other words, when the temperature of the deformation member 106 is increased, the deformation member 106 is inwardly contracted when seen along the central axis Z. On the contrary, when the temperature is decreased, the deformation member 106 is deformed such that the outer curved plate of the deformation member 106 is contracted compared to the inner curved plate and a curvature is decreased. In other words, when the temperature of the deformation member 106 is decreased, the deformation member 106 is expanded outward when seen along the central axis Z.

Next, the normal mode of the adjusting mechanism will be described. The normal mode is an operation mode for maintaining a temperature of the stage ST. The adjusting mechanism 100 operates in the normal mode when the deformation member 106 is in a normal state. The deformation member 106 is in the normal state when the temperature of the deformation member 106 coincides with a target temperature (reference temperature) of the stage ST. In the normal mode, the first through-hole 102a is disposed at a position that is not superposed with the second through-hole 104a when seen along the central axis Z.

When the adjusting mechanism 100 operates in the normal mode, the heat exchange medium discharged from the first, opening end 22a of the first tube 22 and flowing through the flow passage PC is collected in the second tube 24 through the first through-hole 102a, the gap CL, and the second through-hole 104a. Since the width w of the gap CL between the first annular plate 102 and the second annular plate 104 is smaller than the diameter D of the first through-hole 102a and the second through-hole 104a, the flow passage of the heat exchange medium has a small cross sectional area when the first through-hole 102a is disposed at a position that is not superposed with the second through-hole 104a when seen along the central axis Z. Therefore, when the adjusting mechanism 100 operates in the normal mode, the conductance of the flow passage PC of the heat exchange medium is decreased compared to when the adjusting mechanism 100 is set to the first, correction mode to be described later.

Next, the first correction mode of the adjusting mechanism 100 will be described with reference to FIGS. 7A and 7B. FIG. 7A is a perspective view of the adjusting mechanism 100 operating in the first correction mode and FIG. 7B is a top view thereof. The first correction mode is an operation mode for returning the temperature of the stage ST to the target temperature of the stage ST from a first temperature lower than the target temperature. The adjusting mechanism 100 operates in a first operation mode when the temperature of the deformation member 106 reaches the first temperature lower than the target temperature of the stage ST. As shown in FIGS. 7A and 7B, in the first correction mode, the first through-hole 102a is disposed at a position superposed with the second through-hole 104a when seen along the central axis Z.

When the temperature of the deformation member 106 reaches the first temperature lower than the target temperature of the stage ST, the deformation member 106 is deformed to be outwardly expanded about the central axis Z. Due to the deformation, the position of the connecting part 106C connected to the end portion of the deformation member 106 is moved in an opposite direction (i.e., clockwise direction in FIG. 7B) of the winding direction of the deformation member 106 in the circumferential direction of the first annular plate 102. Accordingly, the first annular plate 102 rotates in the opposite direction of the winding direction of the deformation member 106 and the first through-hole 102a moves in a direction toward the second through-hole 104a. As a result, the first through-hole 102a is disposed at a position superposed with the second through-hole 104a when seen from along central axis Z.

When the adjusting mechanism 100 operates in the first correction mode, the heat exchange medium discharged from the first opening end 22a of the first tube 22 and flowing through the flow passage FC is collected in the second tube 24 through the first through-hole 102a and the second through-hole 104a without passing through the gap CL between the first annular plate 102 and the second annular plate 104. Therefore, when the first through-hole 102a is disposed directly above the second through-hole 104a, the cross sectional area of the flow path of the heat exchange medium is increased. Accordingly, when the adjusting mechanism 100 operates in the first correction mode, the conductance of the flow passage PC of the heat exchange medium is increased compared to when the adjusting mechanism 100 operates in the normal mode.

Figure 8:
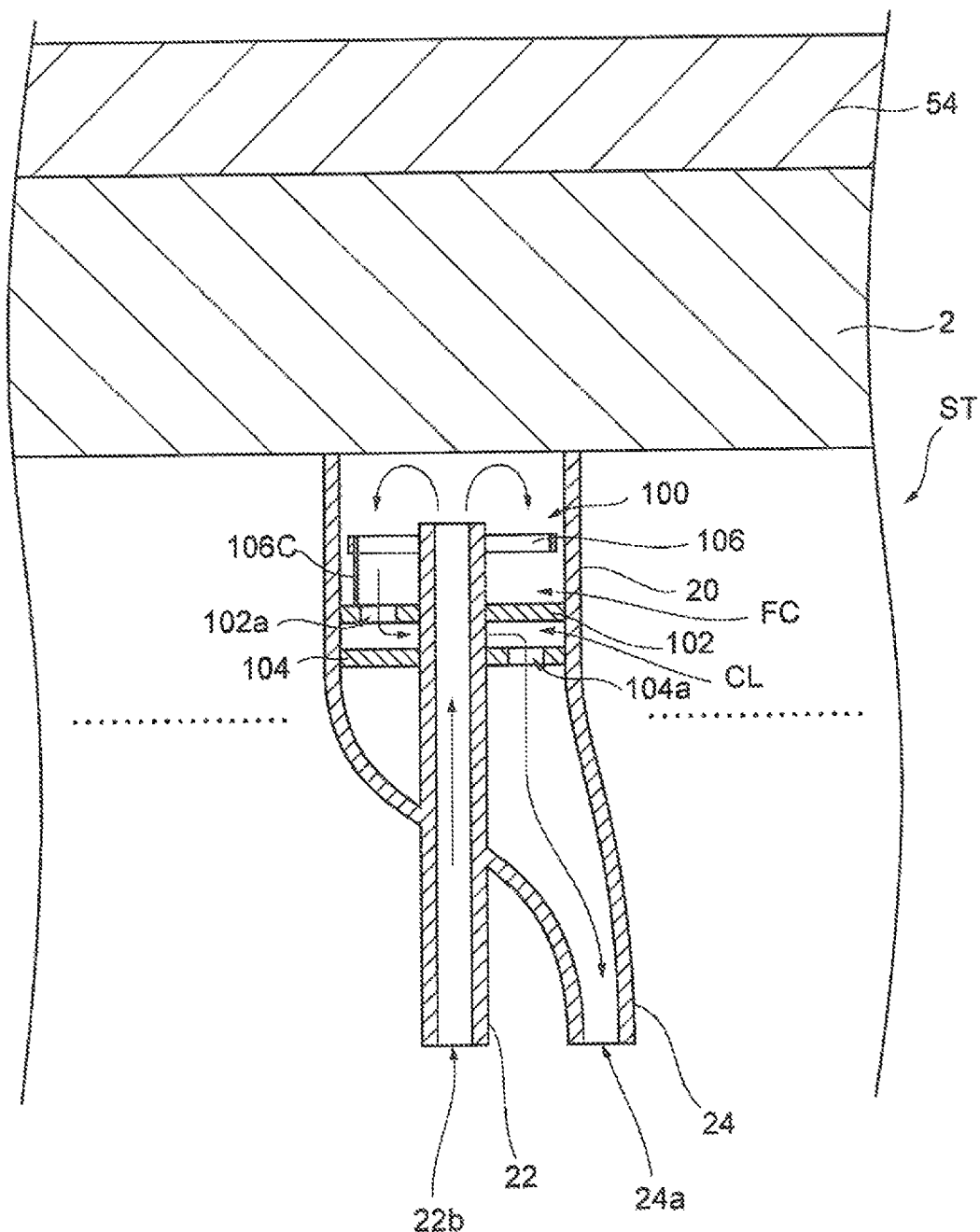
FIGS. 8 and 9 are cross sectional views schematically showing flow of a heat exchange medium in the heat exchanger.

Next, the flow of the heat exchange medium in the stage ST will be described. FIG. 8 is a cross sectional view schematically showing flow of the heat exchange medium in the heat exchanger 6 in the case where the adjusting mechanism 100 operates in the normal mode.

The heat exchange medium supplied from the first opening 16 into the stage ST by the heat exchange, medium supply device 42 passes through the first flow passageways 26 of the flow passageway unit 8 and flows into the first tubes 26 through the second opening ends 22b. The heat exchange medium flowing from the second opening ends 22b moves upward through the first tubes 22 and is discharged toward the bottom surface 2b of the plate 2 from the first opening end 22a. The heat exchange medium discharged from the first opening end 22a exchanges heat with the plate 2 by contact with the bottom surface 2b of the plate 2 facing the first opening end 22a.

The heat exchange medium that has exchanged heat with the plate 2 moves downward through the flow passage FC. The heat exchange medium flowing through the flow passage FC flows into the second tube 24 through the first through-hole 102a, the gap CL between the first annular plate 102 and the second annular plate 104, and the second through-hole 104a. The heat exchange medium flowing into the second tube 24 is discharged to the outside of the space S from the openings 24a of the second tubes 24. The heat exchange medium discharged from the space S returns to the heat exchange medium supply unit 42 through the second flow paths 28 connected to the opening 24a and the second opening 18.

Figure 9:
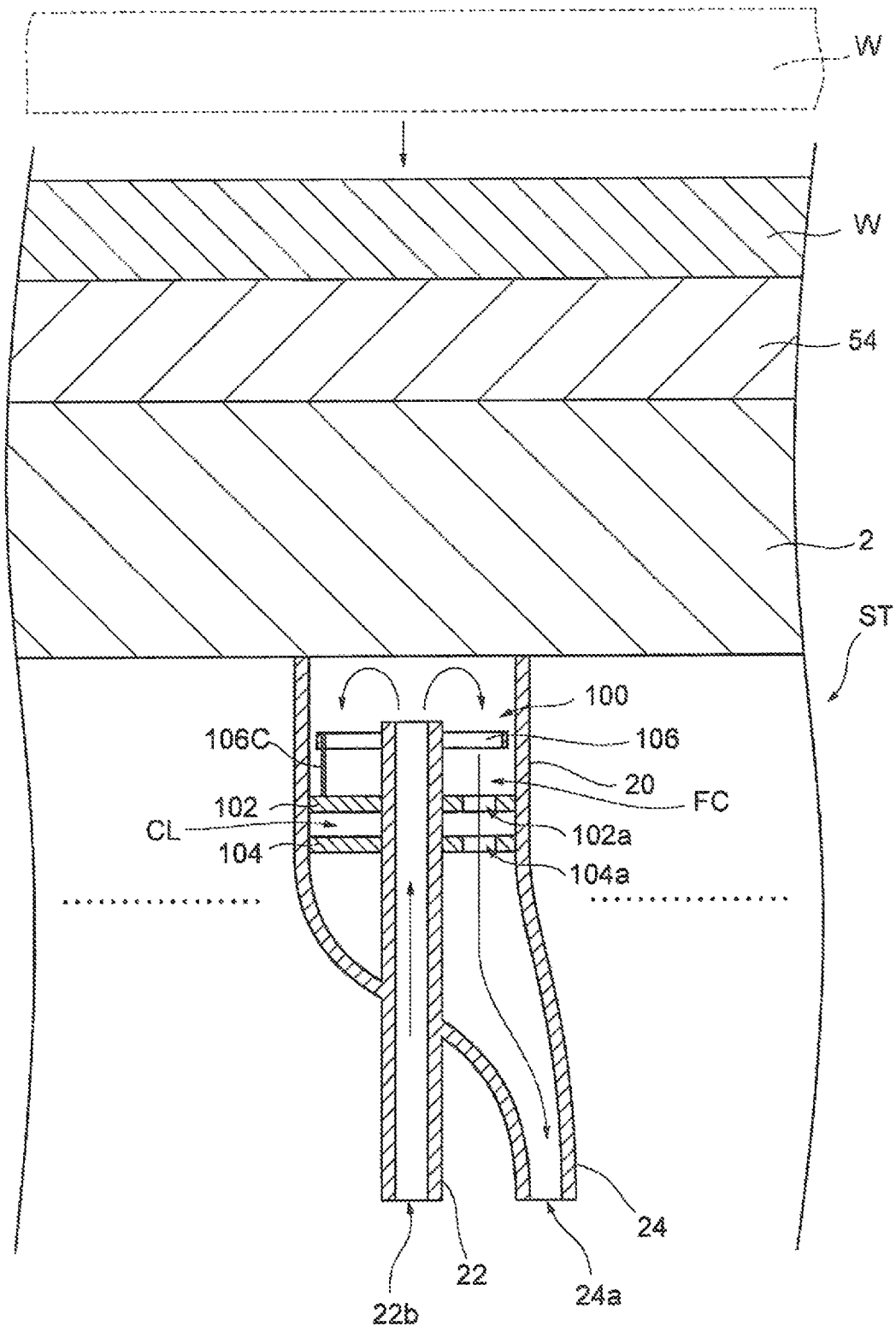

Next, the flow of the heat exchange medium in the stage ST in the case where the temperature of the stage ST is decreased by an external factor will be described with reference to FIG. 9. FIG. 9 is a cross sectional view schematically showing the flow of the heat exchange medium in the heat exchanger 6 in the case where the adjusting mechanism 100 operates in the first correction mode.

The following is description of the case where the substrate W of which temperature is lower than the target temperature of the stage ST is mounted on the stage ST and the temperature of the stage ST is decreased as shown in FIG. 9. When the substrate of a low temperature is mounted on the stage ST, the temperature of the plate 2 is decreased. Accordingly, heat of the heat exchange medium discharged toward the plate 2 is taken by the plate 2 and, thus, the temperature of the heat exchange medium flowing through the flow passage FC becomes lower than the target temperature of the stage ST. As a consequence, the temperature of the deformation member 106 disposed in the flow passage FC is decreased by the heat exchange medium and, thus, the deformation member 106 is deformed to be outwardly expanded when seen along the central axis Z compared to the normal state. When the temperature of the deformation member 106 reaches the first temperature, the first through-hole 102a is disposed at a position superposed with the second through-hole 104a when seen along the central axis Z. In other words, the adjusting mechanism 100 is set to the first correction mode.

As shown in FIG. 9, when the adjusting mechanism 100 operates in the first correction mode, the heat exchange medium flowing through the flow passage FC flows to the second tubes 24 through the first through-holes 102a and the second through-holes 104a without passing through the gap CL between the first annular plate 102 and the second annular plate 104. Therefore, the conductance of the flow passage FC is increased, and the flow rate of the heat exchange medium flowing through the flow passage FC is increased. When the flow rate of the heat exchange medium flowing through the flow passage FC is increased, the amount of heat exchanged between the heat exchange medium and the stage ST is increased. The heat exchange medium of which temperature is set to the target temperature of the stage ST transfers heat to the stage ST having the first temperature. However, when the flow rate of the heat exchange medium in the flow passage FC is increased, the amount of heat that can be transferred from the heat exchange medium to the stage ST is increased. In other words, the operation of the adjusting mechanism 100 in the first correction mode enables the temperature of the stage ST to be returned to the target temperature. When the temperature of the stage ST is made to return to the target temperature by the heating, the deformation member 106 becomes in a normal state and the adjusting mechanism 100 operates in the normal mode.

As described above, in the stage ST, when the temperature of the stage ST is decreased by the external factor, the adjusting mechanism 100 controls the flow rate of the heat exchange medium such that the temperature of the stage ST returns to the target temperature. Since the control is performed in the flow passage FC of the heat exchanger 6, the temperature of the stage ST can be corrected to the target temperature within a short period of time even when the temperature of the stage ST is decreased by the external factor. Further, in the stage ST, the conductance of the flow passage FC is adjusted by the deformation, of the adjusting mechanism 100 in accordance with the temperature of the heat exchange medium flowing through the flow passage PC. Thus, it is possible to autonomously control the temperature of the stage ST without external control.

Next, an adjusting mechanism according to another embodiment will be described. FIG. 10A is a perspective view of an adjusting mechanism 110 according to another embodiment and FIG. 10B is a top view thereof. In the following, the same description as that of the adjusting mechanism 100 will be omitted, and differences will be mainly described.

First, a configuration of the adjusting mechanism 110 will be described. The adjusting mechanism 110 includes a second annular plate 114 instead of the second annular plate 104. A second through-hole 114a and a third through-hole 114b are formed at circumferential positions separated by a predetermined distance d from the central axis Z of the second annular plate 114. In other words, the second through-hole 114a and the third through-hole 114b are formed at the positions through which the first through-hole 102a passes through when seen along the central axis 2 in the case of rotating the first annular plate 102 about the central axis 2. The second through-hole 114a and the third through-hole 114b have the same diameter as that of the first through-hole 102a. In other words, the second through-holes 114a and the third through-hole 114b are circles each having the diameter D.

The adjusting mechanism 110 operates in one of the normal mode, the first correction mode and a second correction mode depending on the temperature of the heat-exchange medium flowing through the flow passage FC. The normal mode, the first correction mode and the second correction mode are different in the conductance of the flow passage FC. The adjusting mechanism 110 operates in the normal mode when the deformation member 106 is in a normal state. Further, the adjusting mechanism 110 operates in the first correction mode when the temperature of the deformation member 106 reaches a first temperature lower than the target temperature of the stage ST. The adjusting mechanism 110 operates in the second correction mode when the temperature of the deformation member 106 reaches a second temperature higher than the target temperature of the stage ST.

First, the adjusting mechanism 110 operating in the normal mode will be described. The normal mode is an operation mode for maintaining the temperature of the stage ST. As shown in FIGS. 10A and 10B, when the adjusting mechanism 110 operates in the normal mode, the first through-hole 102a is positioned between the second through-hole 114a and the third through-hole 114b when seen along the central axis Z. In other words, the second through-hole 114a is formed at one side in the circumferential direction with respect to the circumferential position of the first through-hole 102a at the target temperature (reference temperature), and the third through-hole 114b is formed at the other side in the circumferential direction with respect to the circumferential position of the first through hole 102a at the target temperature.

When the first through hole 102a is disposed at the position that is not superposed with the second through hole 104a when seen along the central axis Z, the heat exchange medium discharged from the first opening end 22a of the first tube 22 and flowing through the flow passage FC is collected in the second tube 24 through the second through hole 114a or the third through hole 114b via the first through hole 102a and the gap CL. Since the width w of the gap CL between the first annular plate 102 and the second annular plate 104 is smaller than the diameter D of the first through hole 102a and the second through hole 104a, the flow passage of the heat exchange medium has a small cross sectional area when the first through hole 102a is disposes at a position that is not superposed with the second through hole 104a when seen along the central axis Z. Therefore, when the adjusting mechanism 110 operates in the normal mode, the conductance of the flow passage FC of the heat exchange medium is reduced compared to when the adjusting mechanism 110 is set to the first correction mode or the second correction mode which will be described later.

Next, the first correction mode of the adjusting mechanism 110 will be described with reference to FIGS. 11A and 11B. FIG. 11A is a perspective view of the adjusting mechanism 110 operating in the first correction mode. FIG. 11B is a top view of the perspective view shown in FIG. 11A. The first correction mode is an operation mode for returning the temperature of the stage ST to the target temperature of the stage ST from the first temperature lower than the target temperature. In the first correction mode, the first through hole 102a is disposed at a position superposed with the second through hole 114a when seen along the central axis Z.

For example, when the temperature of the heat exchange medium reaches the first temperature lower than the target temperature of the stage ST by the mounting of the low-temperature substrate W on the stage ST, the deformation member 106 is deformed to be outwardly expanded, when seen along the central axis Z. Due to the deformation, the position of the connecting part 106C connected to the end portion of the deformation member 106 is moved in the opposite direction (i.e., clockwise direction of FIG. 11B) of the winding direction of the deformation member 106 in the circumferential direction of the first annular plate 102. Accordingly, the first annular plate 102 rotates in the opposite direction of the winding direction of the deformation member 106, and the first through hole 102a moves in a direction toward the second through hole 104a. As a result, the first through hole 102a is disposed at a position superposed with the second through hole 114a when seen along the central axis Z.

When the adjusting mechanism 110 operates in the first correction mode, the heat exchange medium discharged from the first opening end 22a of the first tube 22 and flowing through the flow passage FC is collected in the second tube 24 through the first through hole 102a and the second through hole 114a without passing through the gap CL between the first annular plate 102 and the second annular plate 104. Therefore, when the first through hole 102a is disposed on the second through hole 114a, the cross sectional area of the flow passage of the heat exchange medium is increased. Accordingly, when the adjusting mechanism 110 operates in the first correction mode, the conductance of the flow passage FC of the heat exchange medium is increased compared to when the adjusting mechanism 110 operates in the normal mode.

When the conductance of the heat exchange medium is increased, the flow rate of the heat exchange medium flowing through the flow passage FC is increased. When the flow rate of the heat exchange medium flowing through the flow passage FC is increased, the amount of heat exchanged between the heat exchange medium and the stage ST is increased. The heat exchange medium of which temperature is set to the target temperature of the stage ST transfers heat to the stage ST having the first temperature. However, when the flow rate of the heat exchange medium in the flow passage FC is increased, the amount of heat that can be transferred from the heat exchange medium to the stage ST is increased. In other words, when the adjusting mechanism 110 operates in the first correction mode, the stage ST is heated so that the temperature of the stage ST returns to the target temperature. With this heating, the temperature of the stage ST is corrected to be close to the target temperature. When the temperature of the stage ST is returned to the target temperature with this temperature correction, the deformation member 106 returns to the normal state and the adjusting mechanism 110 operates in the normal mode.

Next, the second correction mode of the adjusting mechanism 110 will be described with reference to FIGS. 12A and 12B. FIG. 12A is a perspective view of the adjusting mechanism 110 operating in the second correction mode and FIG. 12B is a top view thereof. The second correction mode is an operation mode for returning the temperature of the stage ST to the target temperature of the stage ST from the second temperature higher than the target temperature. In the second correction mode, the first through hole 102a is disposed at a position superposed with the third through hole 114b when seen along the central axis Z.

For example, when heat is added to the stage ST by a plasma of a gas which is generated in the processing chamber 52, the temperature of the heat exchange medium flowing through the flow passage FC is increased. When the temperature of the heat exchange medium reaches a second temperature higher than the target temperature of the stage ST, the deformation member 106 is deformed to be inwardly contracted when seen along the central axis Z. Due to the deformation, the position of the connecting part 106C connected to the end portion of the deformation member 106 moves in the winding direction (i.e., counterclockwise direction in FIG. 12B) of the deformation member 106 along the circumferential direction of the first annular plate 102. Accordingly, the first annular plate 102 rotates in the same direction as the winding direction of the deformation member 106, and the first through hole 102a moves in a direction toward the third through hole 114b along the circumferential direction about the central axis Z. As a result, the first through hole 102a is disposed directly above the third through hole 114b.

When the adjusting mechanism 110 operates in the second correction mode, the heat exchange medium discharged from the first opening end 22a of the first tube 22 and flowing through the flow passage FC is collected in the second tube 24 through the first through hole 102a and the third through hole 114b without passing through the gap CL between the first annular plate 102 and the second annular plate 104. Therefore, when the first through hole 102a is disposed directly above the third through hole 114b, the cross sectional, area of the flow passage of the heat exchange medium is increased. Accordingly, when the adjusting mechanism 110 operates in the second correction mode, the conductance of the flow passage FC of the heat exchange medium is increased compared to when the adjusting mechanism 110 operates in the normal mode.

When the conductance of the heat exchange medium is increased, the flow rate of the heat exchange medium flowing through the flow passage FC is increased. When the flow rate of the heat exchange medium flowing through the flow passage FC is increased, the amount of heat exchanged between the heat exchange medium and the stage ST is increased. The heat exchange medium of which temperature is set to the target temperature of the stage ST takes heat from the stage ST having the second temperature. However, when the flow rate of the heat exchange medium flowing through the flow passage FC is increased, the amount of heat transferred from the stage ST to the heat exchange medium is increased. In other words, when the adjusting mechanism 110 operates in the second correction mode, the stage ST is cooled so that the temperature of the stage ST returns to the target temperature. With this cooling, the temperature of the stage ST is corrected to be close to the target temperature. When the temperature of the stage ST returns to the target temperature with this temperature correction, the deformation member 106 returns to the normal state and the adjusting mechanism 110 operates in the normal mode.

As described above, in the stage ST provided with the adjusting mechanism 110, when the temperature of the stage is deviated from the target temperature by an external factor, the temperature of the stage ST can be corrected to the target temperature within a short period of time by increasing the flow rate of the heat exchange medium. Further, the adjusting mechanism 110 enables the temperature of the stage ST to be corrected to the target temperature both in the case where the temperature of the stage ST reaches the first temperature lower than the target temperature and in the case where the temperature of the stage ST reaches the second temperature higher than the target temperature.

Figure 13:
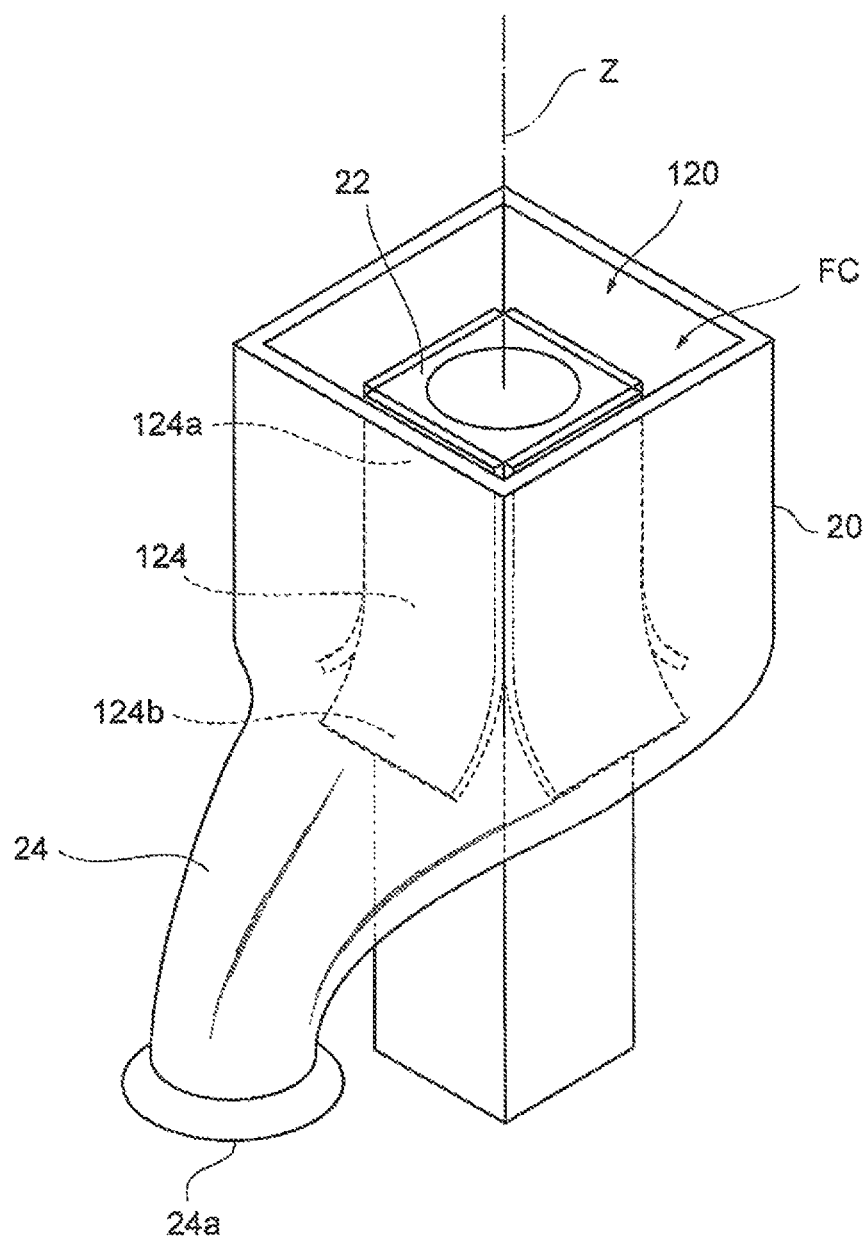
FIG. 13 is a perspective view showing an adjusting mechanism according to still another embodiment.

Next, an adjusting mechanism according to still another embodiment will be described. FIG. 13 is a perspective view of an adjusting mechanism 120 according to still another embodiment. In the present embodiment, as shown in FIG. 13, an outer edge of the first tube 22 may have a rectangular cross sectional shape. The partition wall 20 may define a space having a rectangular cross sectional shape between itself and the first tube 22.

As shown in FIG. 13, the adjusting mechanism 120 includes a plurality of plate-shaped bodies 124. In the embodiment shown in FIG. 13, four plate-shaped bodies 124 are installed along four outer surfaces of the first tube 22. Each of the plate-shaped bodies 124 is configured such that a distance between a lower end 124b to be described later and the first tube 22 varies depending on a temperature of the heat exchange medium.

The plate-shaped body 124 is a plate-shaped member formed by coupling a plate having a relatively high thermal expansion coefficient and a plate having a relatively low thermal expansion coefficient. The plate having a relatively high thermal expansion coefficient is disposed to face the outer surface of the first tube 22. In other words, the plate-shaped body 124 has a bimetal structure in which two plates having different thermal expansion coefficients are bonded.

Each of the plate-shaped bodies 124 has one end 124a and the other end 124b. One end 124a of the plate-shaped body 124 is fixed to an upper portion of the outer surface of the first tube 22. The other end 124b of the plate-shaped body 124 is positioned below the one end 124a. The other end 124b is a free end which is fixed to the outer surface of the first tube 22. The plate-shaped body 124 becomes in a normal state when the temperature of the plate-shaped body 124 coincides with the target temperature of the stage ST. In the normal state, each of the plate-shaped bodies 124 is curved to be gradually closer to the partition wall 20 as it goes from the one end 124a toward the other end 124b, as illustrated in FIG. 13.

When the temperature is increased, the plate-shaped body 124 is deformed such that the curve is increased by the expansion of the plate, disposed at the first tube 22 side, of the plate-shaped body 124 compared to the plate disposed at the partition wall 20 side. On the contrary, when the temperature is decreased, the plate-shaped body 124 is deformed such that the curve is decreased by the contraction of the plate disposed at the first tube 22 side of the plate-shaped body 124 compared to the plate disposed at the partition wall 20 side.

Next, the flow of the heat exchange medium in the stage ST in the normal state of the plate-shaped body 124 will be described. As shown in FIG. 14A, when the plate-shaped body 124 is in the normal state, the plate-shaped body 124 is curved to be gradually closer to the partition wall 20 as it goes from the one end 124a toward the other end 124b. Therefore, a distance between the other end 124b and the first tube 22 is increased and the cross sectional area of the flow passage FC is decreased. Accordingly, when the plate-shaped body 124 is in the normal state, the conductance of the flow passage FC of the heat exchange medium is relatively small.

Next, the flow of the heat exchange medium in the stage ST in the case where the temperature of the stage ST is decreased by an external factor will be described with reference to FIG. 14B. For example, as shown in FIG. 14B, when the substrate W of which temperature is lower than the target temperature of the stage ST is mounted on the stage ST, the temperature of the plate 2 is decreased. Accordingly, heat of the heat exchange medium discharged toward the plate 2 is taken by the plate 2 and the temperature of the heat exchange medium flowing in the flow passage FC becomes lower than the target temperature of the stage ST. Therefore, the plate-shaped body 124 provided in the flow passage FC is cooled by the heat exchange medium. When the plate-shaped body 124 is cooled, the plate-shaped body 124 is deformed such that the curve toward the partition wall 20 becomes smaller. With this deformation, the distance between the other end 124b of the plate-shaped body 124 and the partition wall 20 is increased. Thus, the cross sectional area of the flow passage of the heat exchange medium is increased compared to when the plate-shaped body 124 is in the normal state. As a consequence, the conductance of the flow passage FC of the heat exchange medium is increased.

Due to the increase in the conductance of the flow passage FC of the heat exchange medium, the flow rate of the heat exchange medium flowing through the flow passage FC is increased. When the flow race of the heat exchange medium flowing through the flow passage FC is increased, the amount of heat that can be transferred from the heat exchange medium to the stage ST is increased. Accordingly, when the temperature of the stage ST becomes lower than the target temperature, the temperature of the stage ST is corrected to be closer to the target temperature. When the temperature of the stage ST is returned to the target temperature with this temperature correction, the plate-shaped body 124 returns to the normal state and the flow rate of the heat exchange medium is decreased.

As described above, in the stage ST provided with the adjusting mechanism 120, when the temperature of the stage is deviated from the target temperature by the external factor, it is possible to correct the temperature of the stage ST to the target temperature within a short period of time by increasing the flow rate of the heat exchange medium.

Figure 15:
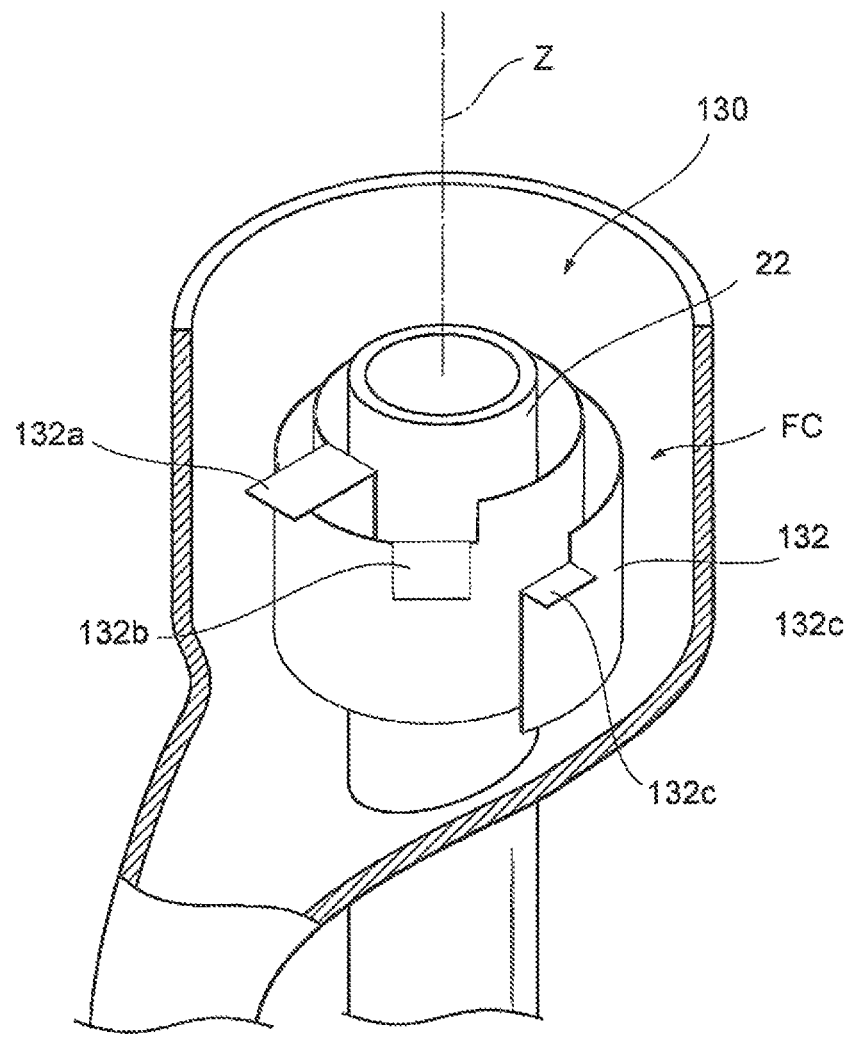
FIG. 15 is a perspective view of an adjusting mechanism according to further still another embodiment.

Next, an adjusting mechanism according to further still another embodiment will be described. FIG. 15 is a perspective view of an adjusting mechanism 130 according to further still another embodiment. In the following, the same description as that of the aforementioned adjusting mechanism 100 will be omitted, and differences will be mainly described.

First, a configuration of the adjusting mechanism 130 will be described. The adjusting mechanism 130 includes a deformation member 132 instead of the first annular plate 102, the second annular plate 104 and the deformation member 106. The deformation member 132 is a strip-shaped plate in which a curved plate having a relatively high thermal expansion coefficient and a curved plate having a relatively low thermal expansion coefficient are bonded. The deformation member 132 is wound in a spiral shape around the first, tube 22 such that the curved plate having a relatively low thermal expansion coefficient is disposed at an inner side. In other words, the deformation, member 132 has a bimetal structure in which two plates having different thermal expansion coefficients are bonded.

The deformation member 132 has one end and the other end. The one end of the deformation member 132 is fixed to an outer surface of the first tube 22. The deformation member 132 is provided with a first to a third projecting plate 132a to 132c which project toward the partition wall 20. The first projecting plate 132a is provided near the one end of the deformation member 132, and the third projecting plate 132c is provided at the other end of the deformation member 132. The second projecting plate 132b is provided between the first projecting plate 132a and the third projecting plate 132c in a lengthwise direction of the deformation member 132. The first to the third projecting plate 132a to 132c are provided at different positions in a height direction.

The adjusting mechanism 130 operates in one of the normal mode and the first correction modes depending on the temperature of the heat exchange medium flowing through the flow passage FC. The adjusting mechanism 130 operates in the normal mode when the deformation member 132 is in a normal state. The adjusting mechanism 130 operates in the first correction mode when the temperature of the deformation member 132 reaches the first temperature lower than the target temperature of the stage ST.

First, the adjusting mechanism 130 operating in the normal mode will be described. The normal mode is an operation mode for maintaining the temperature of the stage ST. As shown in FIG. 15, in the normal mode, the first to the third projecting plate 132a to 132c are disposed at positions that are not superposed with one another when seen along the central axis Z. In the normal mode, the flow of the heat exchange medium in the flow passage FC is disturbed by the first to the third projecting plate 132a to 132c. Therefore, the conductance of the flow passage FC becomes smaller than that in the first correction mode to be described later.

Figure 16:
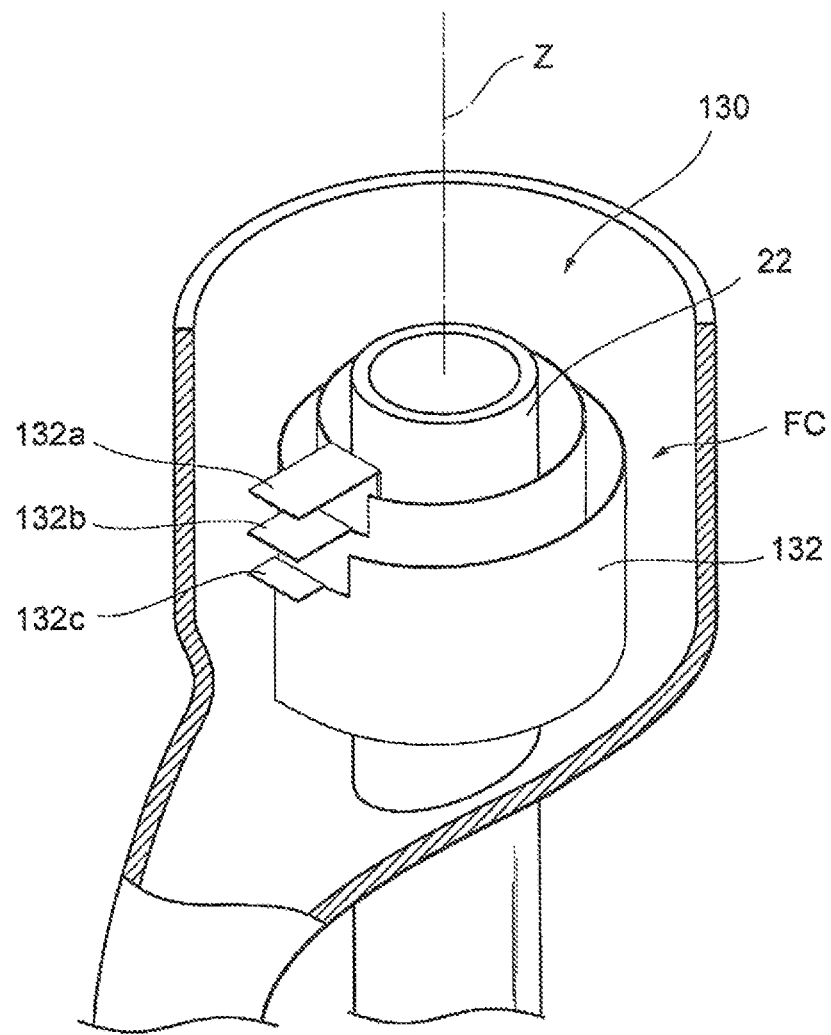
FIG. 16 is a perspective view of the adjusting mechanism according to further still another embodiment.

Next, the first correction mode of the adjusting mechanism 130 will be described with reference to FIG. 16. FIG. 16 is a perspective view of the adjusting mechanism 130 operating in the first correction mode. The first correction mode is an operation mode for returning the temperature of the stage ST to the target temperature of the stage ST from the first temperature lower than the target temperature. In the first correction mode, the first to the third projecting plate 132a to 132c are disposed at positions superposed with one another when seen along the central axis Z.

For example, when the temperature of the heat exchange medium reaches the first temperature lower than the target temperature of the stage ST due to the low-temperature substrate W mounted on the stage ST, the deformation member 132 is deformed to be inwardly contracted when seen along the central axis Z. With this deformation, the first to the third projecting plate 132a to 132c are disposed at positions superposed with one another when seen along the central axis Z, as shown in FIG. 16.

In the first correction mode, the flow of the heat exchange medium in the flow passage FC is disturbed only by the first projecting plate 132a. Therefore, the conductance of the flow passage FC of the heat exchange medium is increased compared to that in the normal mode. When the conductance of the heat exchange medium is increased, the flow rate of the heat exchange medium flowing through the flow passage FC is increased. When the flow rate of the heat exchange medium flowing through the flow passage FC is increased, the amount of heat exchanged between the heat exchange medium and the stage ST is increased. Accordingly, when the adjusting mechanism 110 operates in the first correction mode, the stage ST is heated so that the temperature of the stage ST returns to the target temperature. With this heating, the temperature of the stage ST is corrected to be closer to the target temperature. When the temperature of the stage ST is returned to the target temperature with this temperature correction, the deformation member 132 returns to the normal mode and the adjusting mechanism 130 operates in the normal mode.

As described above, in the stage ST provided with the adjusting mechanism 130, when the temperature of the stage is deviated from the target temperature by the external factor, it is possible to correct the temperature of the stage ST to the target temperature within a short period of time by increasing the flow rate of the heat exchange medium.

While various embodiments have been described, the present invention may be variously modified without being limited to the above-described embodiments. For example, in the above-described embodiments, various types of stages are applied to the plasma processing apparatus. However, the stage may be applied to any substrate processing apparatus without being limited to the plasma processing apparatus.

The above-described adjusting mechanisms 100, 120 and 130 are configured to increase the conductance of the flow passage FC when the temperature of the heat exchange medium is lower than the temperature of the stage ST. However, the adjusting mechanism may be configured to increase the conductance of the flow passage FC when the temperature of the heat exchange medium is higher than the temperature of the stage ST. Such a configuration may be realized by designing a bimetal structure such that the deformation direction determined by temperature changes becomes the opposite to that in the above-described embodiments.

DESCRIPTION OF REFERENCE NUMERALS

2: plate
2a: top surface
2b: bottom surface
4: case
6: heat exchanger
8: flow passageway unit
20: partition wall
22: first tube
22a: first opening end
24: second tube
42: heat exchange medium supply device
50: plasma processing apparatus
52: processing chamber
60: upper electrode
70: gas source
100: adjusting mechanism
102: first annular plate
102a: first through-hole
104: second annular plate
104a: second through-hole
106: deformation member
106C: connecting part
110: adjusting mechanism
114: second annular plate
114a: second through-hole
114b: third through-hole
120: adjusting mechanism
124: plate
124a: one end
124b: the other end
130: adjusting mechanism
132: deformation member
132a: first projecting plate
132b: second projecting plate
132c: third projecting plate
Cnt: control unit
FC: flow passage
PS: processing space
S: space
ST: stage
W: substrate
Z: central axis

What is claimed is:

1. A stage comprising:
   a plate having a top surface on which a substrate is mounted and a bottom surface;
   a plurality of first tubes extending toward different regions of the bottom surface, each of the first tubes having an opening end facing the bottom surface;
   a partition wall defining a plurality of spaces, each of spaces surrounding a respective first tube, each of the spaces respectively forming a flow passage through which a heat exchange medium discharged from the respective first tube flows;
   a plurality of second tubes connected to the partition wall, each of the second tubes configured to communicate with the respective flow passage; and
   a plurality of adjusting mechanisms, each of the adjusting mechanisms provided in the respective flow passage and configured to be deformed depending on a temperature of the heat exchange medium in the respective flow passage to adjust a conductance of the flow passage in accordance with the temperature,
   wherein each of the adjusting mechanisms includes:
   a first annular plate provided between the first tube and the partition wall to be rotatable about a central axis of the first tube, the first annular plate having a first through-hole formed at a position radially spaced from the central axis by a predetermined distance;
   a second annular plate fixed to face the first annular plate, the second annular plate having a second through-hole formed at a position radially spaced from the central axis by the predetermined distance; and
   a deformation member configured to be deformed depending on a temperature of the heat exchange medium to rotate the first annular plate about the central axis such that a relative distance between the first through-hole and the second through-hole in a circumferential direction with respect to the central axis varies, wherein at least a part of the deformation member has a bimetal structure in which two plates having different thermal expansion coefficients are bonded.

2. The stage of claim 1 wherein the second annular plate further includes a third through-hole formed at a position radially spaced from the central axis by the predetermined distance, wherein the second through-hole is disposed at one side in the circumferential direction with respect to a circumferential position of the first through-hole at a reference temperature, and wherein the third through-hole is disposed at the other side in the circumferential direction with respect to the circumferential position of the first through-hole at the reference temperature.

3. A substrate processing apparatus comprising:
a processing chamber; and
a stage in the processing chamber, the stage comprising:
   a plate having a top surface on which a substrate is mounted and a bottom surface;
   a plurality of first tubes extending toward different regions of the bottom surface, each of the first tubes having an opening end facing the bottom surface;
   a partition wall defining a plurality of spaces, each of spaces surrounding a respective first tube, each of the spaces respectively forming a flow passage through which a heat exchange medium discharged from the respective first tube flow;
   a plurality of second tubes connected to the partition wall, each of the second tubes configured to communicate with the respective flow passage; and
   a plurality of adjusting mechanisms, each of the adjusting mechanisms provided in the respective flow passage and configured to be deformed depending on a temperature of the heat exchange medium in the respective flow passage to adjust a conductance of the flow passage in accordance with the temperature, wherein each of the adjusting mechanisms includes:
   a first annular plate provided between the first tube and the partition wall to be rotatable about a central axis of the first tube, the first annular plate having a first throughhole formed at a position radially spaced from the central axis by a predetermined distance;
   a second annular plate fixed to face the first annular plate, the second annular plate having a second through-hole formed at a position radially spaced from the central axis by the predetermined distance; and
   a deformation member configured to be deformed depending on a temperature of the heat exchange medium to rotate the first annular plate about the central axis such that a relative distance between the first through-hole and the second through-hole in a circumferential direction with respect to the central axis varies, wherein at least a part of the deformation member has a bimetal structure in which two plates having different thermal expansion coefficients are bonded.

* * * * *